US010262953B2

(12) United States Patent
Sato

(10) Patent No.: US 10,262,953 B2
(45) Date of Patent: Apr. 16, 2019

(54) SEMICONDUCTOR DEVICE

(71) Applicant: Fuji Electric Co., Ltd., Kanagawa (JP)

(72) Inventor: Kenichiro Sato, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/028,869

(22) Filed: Jul. 6, 2018

(65) Prior Publication Data

US 2019/0067214 A1    Feb. 28, 2019

(30) Foreign Application Priority Data

Aug. 24, 2017    (JP) .................................. 2017-160887

(51) Int. Cl.
| | |
|---|---|
| *H01L 23/373* | (2006.01) |
| *H01L 23/00* | (2006.01) |
| *H01L 23/29* | (2006.01) |
| *H01L 23/367* | (2006.01) |
| *H01L 25/18* | (2006.01) |

(52) U.S. Cl.
CPC .......... *H01L 23/562* (2013.01); *H01L 23/295* (2013.01); *H01L 23/3672* (2013.01); *H01L 23/3735* (2013.01); *H01L 24/73* (2013.01); *H01L 25/18* (2013.01); *H01L 2224/73263* (2013.01); *H01L 2924/10253* (2013.01); *H01L 2924/10272* (2013.01); *H01L 2924/1203* (2013.01); *H01L 2924/12032* (2013.01); *H01L 2924/13055* (2013.01); *H01L 2924/13091* (2013.01); *H01L 2924/35121* (2013.01)

(58) Field of Classification Search
CPC ............. H01L 23/3114; H01L 23/3735; H01L 23/562; H01L 24/02; H01L 24/05; H01L 24/13; H01L 24/29; H01L 24/40; H01L 24/73
See application file for complete search history.

(56) References Cited

U.S. PATENT DOCUMENTS

| | | | |
|---|---|---|---|
| 2009/0279276 A1* | 11/2009 | Yoshida | ................ H01L 23/367 361/808 |
| 2012/0140420 A1* | 6/2012 | Soyano | ............... H01L 23/3672 361/715 |
| 2017/0154855 A1* | 6/2017 | Oi | ........................... H01L 24/40 |

FOREIGN PATENT DOCUMENTS

JP    2013-500580 A    1/2013

* cited by examiner

*Primary Examiner* — Cuong Q Nguyen
(74) *Attorney, Agent, or Firm* — Chen Yoshimura LLP

(57) ABSTRACT

A semiconductor device includes a heat dissipating unit that includes a primary part made of a first metal material and an embedded part that is embedded in a front surface of the primary part and that is made of a second metal material, a front surface of the heat dissipating unit having a mounting region on which a rear surface of a semiconductor element substrate is mounted so as to dissipate heat generated by the semiconductor element; and a sealing member that seals the semiconductor element, the substrate, and a sealed region of the front surface of the heat dissipating unit, wherein the embedded part is formed in the sealed region, and an absolute difference of the linear expansion coefficient of the second metal material and that of the sealing member is less than or equal to 25% of a value of the linear expansion coefficient of the sealing member.

20 Claims, 15 Drawing Sheets

|  | Linear expansion coefficient of sealing member (ppm/°C) | Embedded part and linear expansion coefficient thereof | | Difference in linear expansion coefficients | Peeling |
|---|---|---|---|---|---|
|  |  | Material | Linear expansion coefficient (ppm/°C) |  |  |
| 1-1 | 14 | Cu | 17.1 | -22 | No |
| 1-2 | 14 | Al | 24.3 | -74 | Yes |
| 1-3 | 14 | Al-SiC | 16.4 | -17 | No |
| 2-1 | 16 | Cu | 17.1 | -7 | No |
| 2-2 | 16 | Al | 24.3 | -52 | Yes |
| 2-3 | 16 | Al-SiC | 12.4 | 23 | No |
| 3-1 | 18 | Cu | 17.1 | 5 | No |
| 3-2 | 18 | Al | 24.3 | -35 | Yes |
| 3-3 | 18 | Al-SiC | 16.4 | 20 | No |

FIG. 3

SEMICONDUCTOR DEVICE

BACKGROUND OF THE INVENTION

Technical Field

The present invention relates to a semiconductor device.

Background Art

Semiconductor devices containing semiconductor elements such as IGBTs (insulated gate bipolar transistors) and power MOSFETs (metal oxide semiconductor field effect transistors) are being used as power converters, for example. This type of semiconductor device includes such semiconductor elements and a substrate that includes an insulated plate and a plurality of circuit patterns formed on the front surface of the insulated plate, the semiconductor elements being arranged in the circuit patterns. Furthermore, in order to cool the heat generated by the semiconductor elements during operation, the substrate of the semiconductor device is disposed on a heat dissipating unit such as a heat sink made of copper, for example.

A heat dissipating unit made with copper as the main constituent can have high dissipating characteristics, but is heavy and increases costs.

As a countermeasure, a composite type heat dissipating unit is used in which the main constituent is aluminum, which is advantageous in terms of cost and processability in addition to heat dissipating characteristics, and in which copper is embedded in the arrangement region of the substrate. Using this type of composite heat dissipating unit makes it possible to maintain uniform heat dissipating characteristics while making the device lightweight (see Patent Document 1).

Related Art Document

Patent Document

Patent Document 1: Japanese Translation of PCT International Application No. 2013-500580

SUMMARY OF THE INVENTION

When the substrate disposed on the composite heat dissipating unit is sealed with a sealing member (an epoxy resin, for example), there have been cases where the epoxy resin has peeled from the heat dissipating unit while using the semiconductor device. This led to a decrease in reliability of the semiconductor device.

The present invention was made in view of the above and aims at providing a semiconductor device with which a sealing member can be prevented from peeling from a heat dissipating unit.

Diligent examination by the inventors of the present invention has found that the epoxy resin will peel from the heat dissipating unit due to thermal cycling while using the semiconductor device, because the linear expansion coefficient of the sealing member and the linear expansion coefficient of a portion of the heat dissipating unit contacting the sealing member greatly differ from each other.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor element; a substrate that includes an insulated plate and a circuit layer on a front surface of the insulated plate, the semiconductor element being disposed on a front surface of the circuit layer; a heat dissipating unit that includes a primary part made of a first metal material and an embedded part that is embedded in a front surface of the primary part and that is made of a second metal material, a front surface of the heat dissipating unit having a mounting region on which a rear surface of the substrate is mounted so as to dissipate heat generated by the semiconductor element; and a sealing member that seals the semiconductor element, the substrate, and a sealed region of the front surface of the heat dissipating unit that is defined as an exposed region that is adjacent to the mounting region and that is not covered by the substrate, wherein the embedded part is formed in an area in the front surface of the heat dissipating unit that includes at least an entirety of the sealed region, and wherein a linear expansion coefficient of the second metal material is less than a linear expansion coefficient of the first metal material, and an absolute difference of the linear expansion coefficient of the second metal material and a linear expansion coefficient of the sealing member is less than or equal to 25% of a value of the linear expansion coefficient of the sealing member.

In the aforementioned semiconductor device, the sealed region may surround the mounting region in a plan view. In this case, the area in which the embedded part is formed extends beyond the sealed region and includes an entirety of the mounting region in the plan view.

In the aforementioned semiconductor device, a volumetric mass density of the first metal material may be less than a volumetric mass density of the second metal material.

In the aforementioned semiconductor device, the linear expansion coefficient of the second metal material may be greater than or equal to 10.5 ppm/° C. and is less than or equal to 22.5 ppm/° C. The linear expansion coefficient of the second metal material may be preferably greater than or equal to 16.0 ppm/° C. and is less than or equal to 18.0 ppm/° C. In this case, the second metal material may be copper, a copper alloy, or a metal matrix composite material. The metal matrix composite material may be a composite material containing silicon carbide. Furthermore, the metal matrix composite material may contain one of aluminum and magnesium in addition to the silicon carbide.

In the aforementioned semiconductor device, the area in which the embedded part is formed may extend beyond the sealed region and include a part of the mounting region in a plan view so that an inner edge of said area is positioned inside the mounting region on which the substrate is mounted in the plan view.

In the aforementioned semiconductor device, a linear expansion coefficient of the sealing member may be greater than or equal to 14.0 ppm/° C. and is less than or equal to 18.0 ppm/° C. In this case, the sealing member may include an epoxy resin and a filler contained in the epoxy resin. The filler may be silicon dioxide, aluminum oxide, boron nitride, or aluminum nitride.

In the aforementioned semiconductor device, the first metal material may be aluminum or an aluminum alloy.

The aforementioned semiconductor device may further include a case having sidewalls that are mounted, via a bonding material, on a peripheral region of the front surface of the heat dissipating unit that surrounds the sealed region. In this case, the area in which the embedded part is formed may extend beyond the sealed region and include a part of the peripheral region in a plan view so that an outer edge of said area is positioned inside the peripheral region on which the sidewalls of the case are mounted in the plan view. A metal film or an oxide film may be formed in the peripheral region of the heat dissipating unit.

In the aforementioned semiconductor device, the embedded part may have a plurality of protrusions that protrude from the front surface of the heat dissipating unit in the sealed region.

In the aforementioned semiconductor device, the embedded part may have a plurality of recesses in the front surface of the heat dissipating unit in the sealed region.

In the aforementioned semiconductor device, the primary part of the heat dissipating unit may include: a flat plate part having a flat plate shape, the mounting region and the sealed region being defined in a front surface of the flat plate part; and a fin part having a plurality of fins extending downwardly, formed on a rear surface of the flat plate part.

The technology in the present disclosure makes it possible to prevent peeling of a sealing resin from a heat dissipating unit, thus preventing a decrease in reliability of the semiconductor device.

It is to be understood that both the foregoing general description and the following detailed description are exemplary and explanatory, and are intended to provide further explanation of the invention as claimed.

BRIEF DESCRIPTION OF THE DRAWINGS

FIG. 3 is a table showing statuses of peeling of a sealing member from an embedded part based on a difference of the linear expansion coefficient of the sealing member and the linear expansion coefficient of the embedded part in the semiconductor device of Embodiment 1.

DETAILED DESCRIPTION OF EMBODIMENTS

The embodiments will be described hereafter with reference to the drawings.

Embodiment 1

Figure 1:
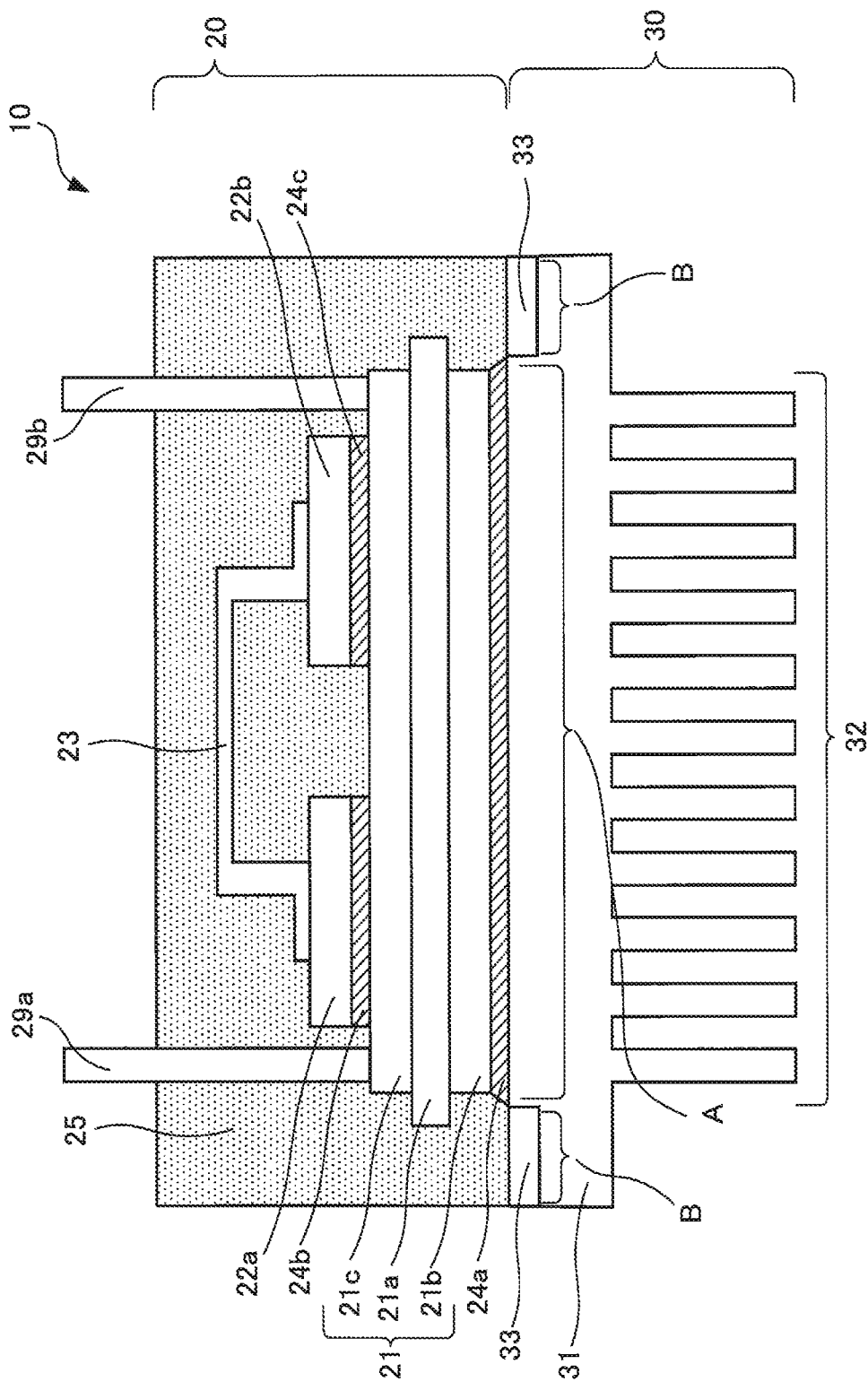
FIG. 1 shows a side cross-sectional view of a semiconductor device of Embodiment 1.
Figure 2:
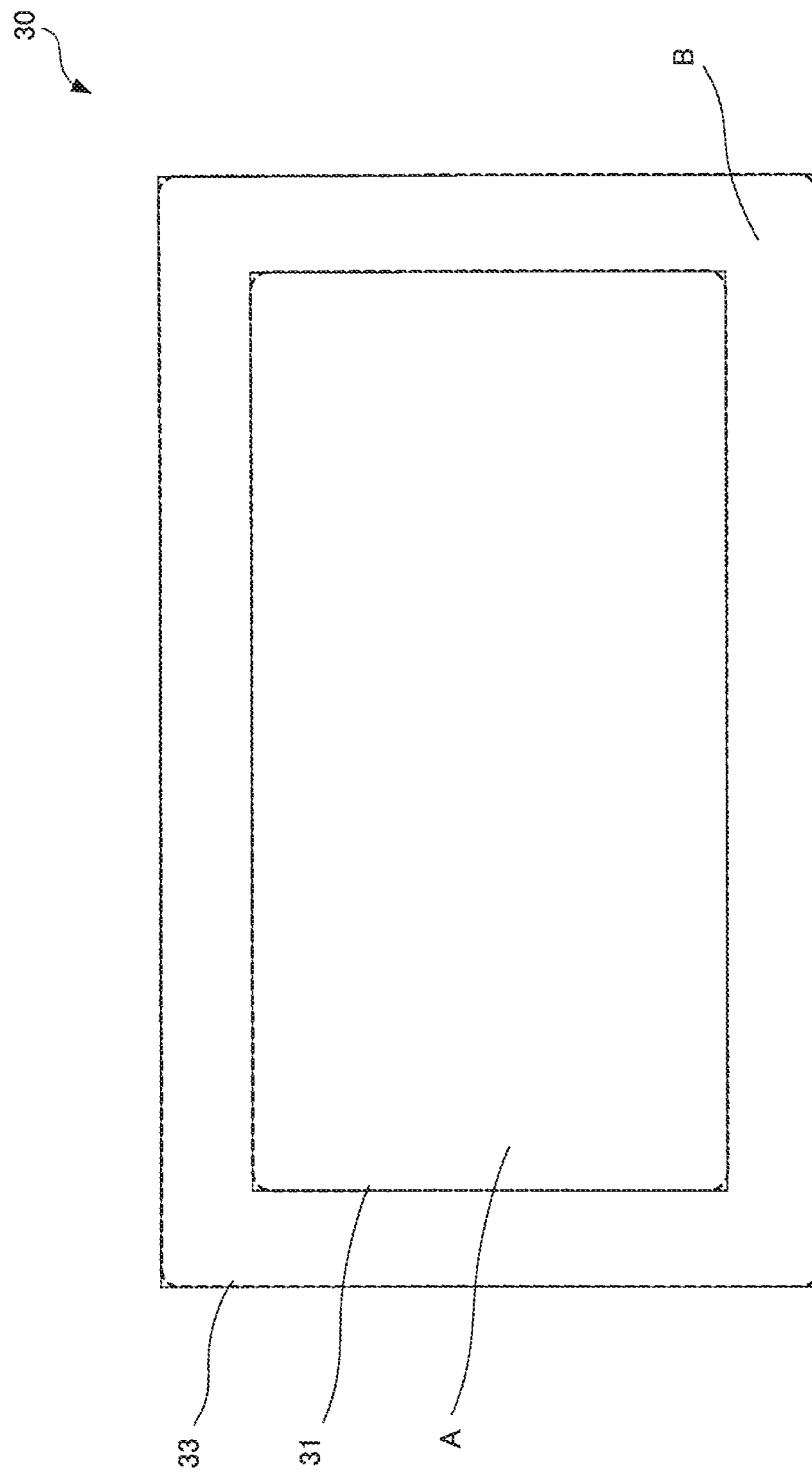
FIG. 2 shows a plan view of a heat dissipating unit of the semiconductor device of Embodiment 1.

First, a semiconductor device according to Embodiment 1 will be described with reference to FIG. 1 and FIG. 2. FIG. 1 is a side cross-sectional view of a semiconductor device of Embodiment 1, and FIG. 2 is a plan view of a heat dissipating unit of the semiconductor device of Embodiment 1. FIG. 2 shows a plan view of the front surface of the heat dissipating unit 30 (on the side where a semiconductor unit 20 is placed).

The semiconductor device 10 contains the semiconductor unit 20 and the heat dissipating unit 30.

As shown in FIG. 1, the semiconductor unit 20 has a ceramic circuit substrate 21 (substrate), semiconductor elements 22a and 22b bonded to the front surface of the ceramic circuit substrate 21, a connection terminal 23 electrically connecting the main electrodes of the semiconductor elements 22a and 22b, and external connection terminals 29a and 29b that electrically connect to the top of the ceramic circuit substrate 21. The semiconductor unit 20 is sealed by a sealing member 25, except for the top ends of the external connection terminals 29a, 29b. The number (or placement) of the semiconductor elements 22a, 22b bonded on the ceramic circuit substrate 21 (circuit layer 21c, described later) is merely one example, and a number or placement other than those shown in FIG. 1 may be used as long as the elements are disposed on the ceramic circuit substrate 21 (circuit layer 21c).

The ceramic circuit substrate 21 has an insulated plate 21a, a metal layer 21b formed on the rear surface of the insulated plate 21a, and a circuit layer 21c formed on the front surface of the insulated plate 21a.

The insulated plate 21a is formed of a ceramic with high thermal conductivity, such as aluminum oxide, aluminum nitride, or silicon nitride, which have excellent thermal conductivity.

The metal layer 21b is formed of a metal such as aluminum, iron, silver, or copper, which have excellent thermal conductivity, or an alloy containing at least one of these metals.

The circuit layer 21c contains a plurality of circuit patterns and is made of a material with excellent conductivity. Examples of this type of material include aluminum, copper, or an alloy containing at least one of these metals.

The circuit substrate 21 having this type of configuration can be a DCB (direct copper bonding) substrate or an AMB (active metal blazed) substrate, for example. The ceramic circuit substrate 21 can transfer heat generated by the semiconductor elements 22a, 22b to the heat dissipating unit 30 side through the circuit layer 21c, insulated plate 21a, and metal layer 21b.

The insulated plate 21a has a rectangular shape in a plan view, for example. The metal layer 21b also has a rectangular shape in a plan view, with a smaller area than the insulated plate 21a. Therefore, the ceramic circuit substrate 21 has a rectangular shape, for example.

The semiconductor elements 22a, 22b contain a switching element such as an IGBT or power MOSFET made of silicon or silicon carbide, for example. These semiconductor elements 22a, 22b each have a drain electrode (or collector electrode) on the rear surface thereof as the main electrode, and a gate electrode and source electrode (or emitter electrode) on the front surface thereof as the main electrode, for example.

The semiconductor elements 22a, 22b contain a diode such as an SBD (Schottky barrier diode) or FWD (freewheeling diode) as necessary. These semiconductor elements 22a, 22b each have a cathode electrode on the rear surface thereof as the main electrode, and an anode electrode on the front surface thereof as the main electrode. The semiconductor elements 22a, 22b each have a rear surface thereof bonded on a prescribed circuit pattern (not shown) of the circuit layer 21c.

The semiconductor elements 22a, 22b are bonded to the circuit layer 21c via solder 24b, 24c.

The connection terminal 23 and external connection terminals 29a, 29b are lead frames made of a material with excellent conductivity, for example. Examples of this type of material include aluminum, copper, or an alloy containing at least one of these metals.

The sealing member 25 contains a thermosetting resin such as a maleimide-modified epoxy resin, maleimide-modified phenol resin, or maleimide resin, and a filler contained in the thermosetting resin, for example. An example of this type of sealing member 25 includes an epoxy resin and a filler in the epoxy resin such as silicon dioxide, aluminum oxide, boron nitride, or aluminum nitride. The linear expansion coefficient of this example of the sealing member 25 is 14.0 ppm/° C. to 18.0 ppm/° C. inclusive, in accordance with the amount of the filler. Note that the linear expansion coefficient is an average linear expansion coefficient at 20° C. to 100° C. inclusive. The sealing member 25 is solidified while sealing the ceramic circuit substrate 21, semiconductor elements 22a, 22b, and connection terminal 23, as described later.

The heat dissipating unit 30 of the semiconductor device 10 has a flat plate part 31, a fin part 32, and an embedded part 33.

As shown in FIG. 1 and FIG. 2, for example, the heat dissipating unit 30 has set on the front surface thereof a mounting region A where the ceramic circuit substrate 21 is disposed via the solder 24a, and a sealed region B adjacent to the mounting region A, surrounding the mounting region A, and on which the sealing member 25 is bonded. This type of heat dissipating unit 30 has, on the front surface thereof, the flat plate part 31, which has the mounting region A, and the embedded part 33, which is embedded in the sealed region B. The flat plate part 31 is made of a first metal material, and the embedded part 33 is made of a second metal material with a smaller linear expansion coefficient than the first metal material. The sealed region B is dug in the flat plate part 31. The thickness of the flat plate part 31 is 1 mm to 10 mm inclusive, and more preferably 2 mm to 5 mm inclusive. Furthermore, the dig depth of the sealed region B is 0.5 mm to 8 mm inclusive, and more preferably 1 mm to 3 mm inclusive.

The flat plate part 31 also has the fin part 32, which is made of a plurality of fins, formed integrally on the rear surface thereof. The fin part 32 is formed close to the rear surface of the flat plate part 31 corresponding to the mounting region A. The first metal material forming the flat plate part 31 and fin part 32 (hereinafter together referred to as the primary part) is aluminum or an aluminum alloy, for example. The linear expansion coefficient of the primary part made of the aluminum or aluminum alloy is generally 23.0 ppm/° C. to 25.0 ppm/° C. inclusive.

The embedded part 33 is embedded inside the sealed region B that is dug into the front surface of the flat plate part 31. Here, the front surface of the mounting region A of the flat plate part 31 and the front surface of the embedded part 33 are horizontal. The second metal material forming this type of embedded part 33 is copper or a copper alloy, for example. The linear expansion coefficient of the embedded part 33 formed of the copper or copper alloy is 16.0 ppm/° C. to 18.0 ppm/° C. inclusive. Furthermore, the second metal material forming the embedded part 33 may be an MMC (metal matrix composite) such as a composite material of aluminum and silicon carbide (Al—SiC) or a composite material of magnesium and silicon carbide (Mg—SiC), for example. The linear expansion coefficient of the embedded part 33 made of an MMC is 10.5 ppm/° C. to 22.5 ppm/° C. inclusive.

Furthermore, a material of the primary part is selected to have the volumetric mass density that is less than the volumetric mass density of the embedded part 33. In the case described above, the volumetric mass density when the primary part is aluminum or an aluminum alloy is 2.7 g/cm$^3$. Meanwhile, the volumetric mass density when the embedded part 33 is copper or a copper alloy is 8.9 g/cm$^3$, and when the embedded part 33 is an MMC, the volumetric mass density is 2.8 g/cm$^3$.

In regard to the volume of the heat dissipating unit 30 of the semiconductor device 10, the primary part makes up 90% of the volume, and the embedded part 33 makes up 10%. Therefore, in terms of the weight ratio, assuming that the weight of the heat dissipating unit 30 made completely of copper is 100, then the weight of the heat dissipating unit 30 when the primary part is made of aluminum or an aluminum alloy and the embedded part 33 is made of copper or a copper alloy would be 37. Accordingly, the volumetric mass density of the primary part is less than the volumetric mass density of the embedded part 33, and the volume of the primary part is sufficiently larger than the volume of the embedded part 33, which makes it possible to suppress an increase in weight of the heat dissipating unit 30.

In contrast to the heat dissipating unit 30 being made completely of copper, which is assumed to have a weight of 100, the weight when the heat dissipating unit 30 is made completely of aluminum is 30, which allows the device to be made lightweight. However, as already described, if the heat dissipating unit 30 is made completely of aluminum, the sealing member 25 will peel.

Furthermore, in contrast to the case where the heat dissipating unit 30 is made completely of copper, which is assumed to have a weight of 100, the weight when the heat dissipating unit 30 is made completely of an MMC is 31, which also allows the device to be made lightweight. However, an MMC is expensive, and thus increases manufacturing costs.

It is preferable that the mounting region A of the front surface of the heat dissipating unit 30 be plated with nickel, copper, tin, or the like, in order to solder the ceramic circuit substrate 21. The thickness of the plating is 10 μm to 100 μm inclusive.

The solder 24a, 24b, 24c used with the semiconductor device 10 is, for example, a lead-free solder having as a main component thereof at least one alloy among an alloy made of tin-silver-copper, an alloy made of tin-zinc-bismuth, an alloy made of tin-copper, or an alloy made of tin-silver-indium-bismuth. The solder may also contain an additive such as nickel, germanium, cobalt, or silicon.

When manufacturing this type of semiconductor device 10, first the ceramic circuit substrate 21, semiconductor elements 22a and 22b, connection terminal 23, and external connection terminals 29a and 29b are prepared. Then, the heat dissipating unit 30 is prepared, which has the flat plate part 31, fin part 32, and embedded part 33 embedded in the sealed region B dug around the mounting region A on the front surface of the flat plate part 31.

The embedded part 33 of the heat dissipating unit 30 corresponding to the shape of the sealed region B dug into the flat plate part 31 is formed in advance. The prepared embedded part 33 is set in the dug sealed region B, and then the embedded part 33 and the flat plate part 31 are integrated by friction stir welding.

The ceramic circuit substrate 21 is disposed on the mounting region A of the flat plate part 31 via solder paste or a solder plate. Furthermore, the semiconductor elements 22a and 22b, which are connected by the connection terminal 23, are each disposed on a prescribed region of the circuit layer 21c of the ceramic circuit substrate 21 via solder paste or a solder plate. The external connection terminals 29a and 29b are also each disposed on a prescribed region of the circuit layer 21c of the ceramic circuit substrate 21 via solder paste or a solder plate.

The solder paste or solder plate is heated and melted in this state, and the melted solder is solidified. This adheres the ceramic circuit substrate 21 to the mounting region A of the flat plate part 31 via the solder 24a, and adheres the semiconductor elements 22a and 22b on the ceramic circuit substrate 21 via the solder 24b, 24c. The external connection terminals 29a, 29b are also adhered on the circuit layer 21c of the ceramic circuit substrate 21 via solder (not shown).

The heat dissipating unit 30, on the mounting region A of which the ceramic circuit substrate 21 having the semiconductor elements 22a, 22b (and external connection terminals 29a, 29b) adhered thereto is adhered, is set in a prescribed mold, and a sealing material in a melted state is injected into the mold. The injected sealing material is sufficiently solidified (thus forming the sealing member 25), and the mold is removed.

This forms the semiconductor device 10 in which the ceramic circuit substrate 21, semiconductor elements 22a, 22b, connection terminal 23, and sealed region B of the heat dissipating unit 30 are sealed by the sealing member 25.

In the semiconductor device 10 configured in this manner, the smaller the difference of the linear expansion coefficient of the sealing member 25 and the linear expansion coefficient of the embedded part 33 (sealed region B) is, the more that the sealing member 25 can be prevented from peeling from the embedded part 33 (sealed region B) due to thermal cycling while using the semiconductor device 10.

FIG. 3 will be used to describe statuses of peeling of the sealing member 25 from the embedded part 33 depending on the difference of the linear expansion coefficient of the sealing member 25 and the linear expansion coefficient of the embedded part 33.

FIG. 3 is a table showing the statuses of peeling of the sealing member from the embedded part based on the difference of the linear expansion coefficient of the sealing member 25 and the linear expansion coefficient of the embedded part 33 in the semiconductor device of Embodiment 1.

In FIG. 3, the table shows the cases in which the embedded part 33 is copper, aluminum, and a composite material of aluminum and silicon carbide while the sealing member 25 has three types of linear expansion coefficients (14 ppm/° C., 16 ppm/° C., 18 ppm/° C.). The peeling status (adhere or peeled) is indicated for the differences in the linear expansion coefficients between the sealing member 25 and embedded part 33 in these cases.

The differences in the linear expansion coefficients in FIG. 3 are obtained by the following equation.

Difference (%) in linear expansion coefficients=(linear expansion coefficient of sealing member 25−linear expansion coefficient of embedded part 33)/(linear expansion coefficient of sealing member 25)×100.

Furthermore, the results in FIG. 3 are from observing the peeling status via an ultrasonic microscope (scanning acoustic tomography (SAT)) by performing a thermal cycling test for each combination of the sealing member 25 and embedded part 33. The thermal cycling test changes the temperature in a range between −40° C. to 125° C. and repeats this 100 times.

According to the results, it was observed that, if the difference of the linear expansion coefficient of the sealing member 25 and the linear expansion coefficient of the embedded part 33 is in a range of 23% to −22% ("1-1," "1-3," "2-1," "2-3," "3-1," "3-3"), then peeling has not occurred in each case. In other words, if the absolute difference of the linear expansion coefficient of the sealing member 25 and the linear expansion coefficient of the embedded part 33 is less than or equal to approximately 25% of a value of the linear expansion coefficient of the sealing member 25, then it is thought that peeling does not occur between the sealing member 25 and the embedded part 33.

Accordingly, the semiconductor device 10 has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. Furthermore, the semiconductor device 10 has the heat dissipating unit 30 having the flat plate part 31 and fin part 32 made of the first metal material and the embedded part 33 made of the second metal material and embedded in the front surface of the flat plate part 31, and the sealing member 25 that seals the semiconductor elements 22a, 22b, ceramic circuit substrate 21, and the front surface of the heat dissipating unit 30. Moreover, in the semiconductor device 10, the front surface of the heat dissipating unit 30 includes the mounting region A on which the ceramic circuit substrate 21 is disposed, and the sealed region B adjacent to the mounting region A and sealed with the sealing member 25. The embedded part 33 is formed in at least the sealed region B, the linear expansion coefficient of the second metal material is less than the linear expansion coefficient of the first metal material, and the absolute difference of the linear expansion coefficient of the second metal material and the linear expansion coefficient of the sealing member is less than or equal to 25% of a value of the linear expansion coefficient of the sealing member.

In this type of semiconductor device 10, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10, the absolute difference of the linear expansion coefficient of the sealing member 25 and the linear expansion coefficient of the embedded part 33 in the sealed region B of the heat dissipating unit 30 sealed by the sealing member 25 is less than or equal to 25% of the value of the linear expansion coefficient of the sealing member 25, which makes it possible to suppress peeling of the sealed member 25 in the sealed region B of the heat dissipating unit 30.

Moreover, the primary part, which makes up a large portion of the heat dissipating unit 30, is made of aluminum or an aluminum alloy, and the embedded part 33 is made of copper or a copper alloy (or an MMC), and thus the heat dissipating unit can be made lightweight.

Accordingly, the semiconductor device 10 makes it possible to lower costs and suppress a decrease in reliability.

Embodiment 2

In Embodiment 2, an example will be described in which, in the semiconductor device 10 of Embodiment 1, a contact surface (boundary) between the side face of the dug portion of the flat plate part 31 of the heat dissipating unit 30 and the side face of the embedded part 33 is positioned below the ceramic circuit substrate 21.

A semiconductor device 10a of Embodiment 2 will be described using FIG. 4 and FIG. 5.

Figure 4:
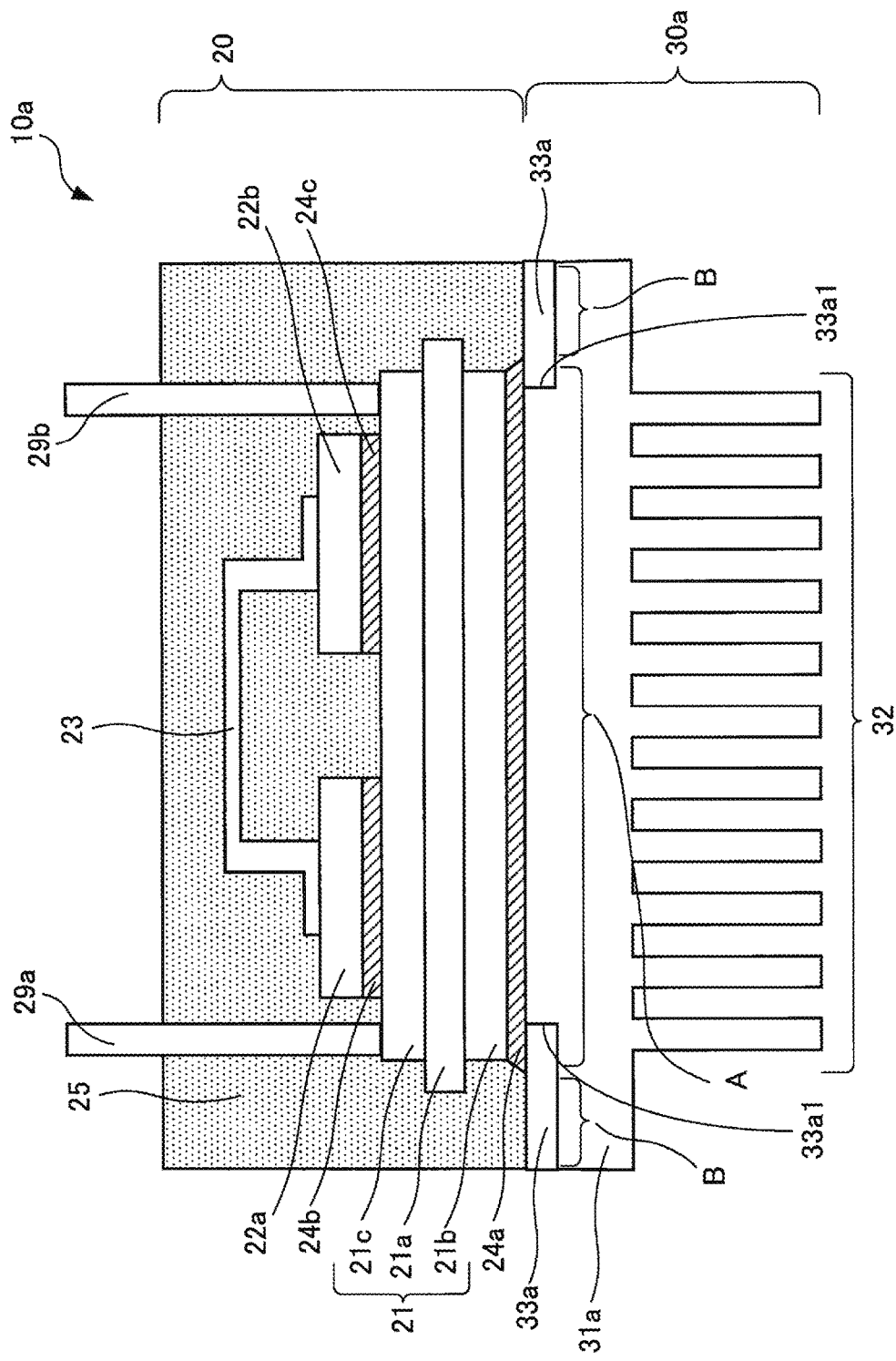
FIG. 4 shows a side cross-sectional view of a semiconductor device of Embodiment 2.

FIG. 4 shows a side cross-sectional view of a semiconductor device of Embodiment 2. FIG. 5 shows a plan view of a heat dissipating unit of the semiconductor device of Embodiment 2. FIG. 5 shows a plan view of the front surface of a heat dissipating unit 30a (on the side where the semiconductor unit 20 is placed).

In Embodiment 2, the same reference characters are given to configurations that are the same as Embodiment 1, and explanations of these configurations may be omitted.

The semiconductor device 10a contains the semiconductor unit 20 and the heat dissipating unit 30a.

The heat dissipating unit 30a has a flat plate part 31a, the fin part 32, and an embedded part 33a.

Figure 5:
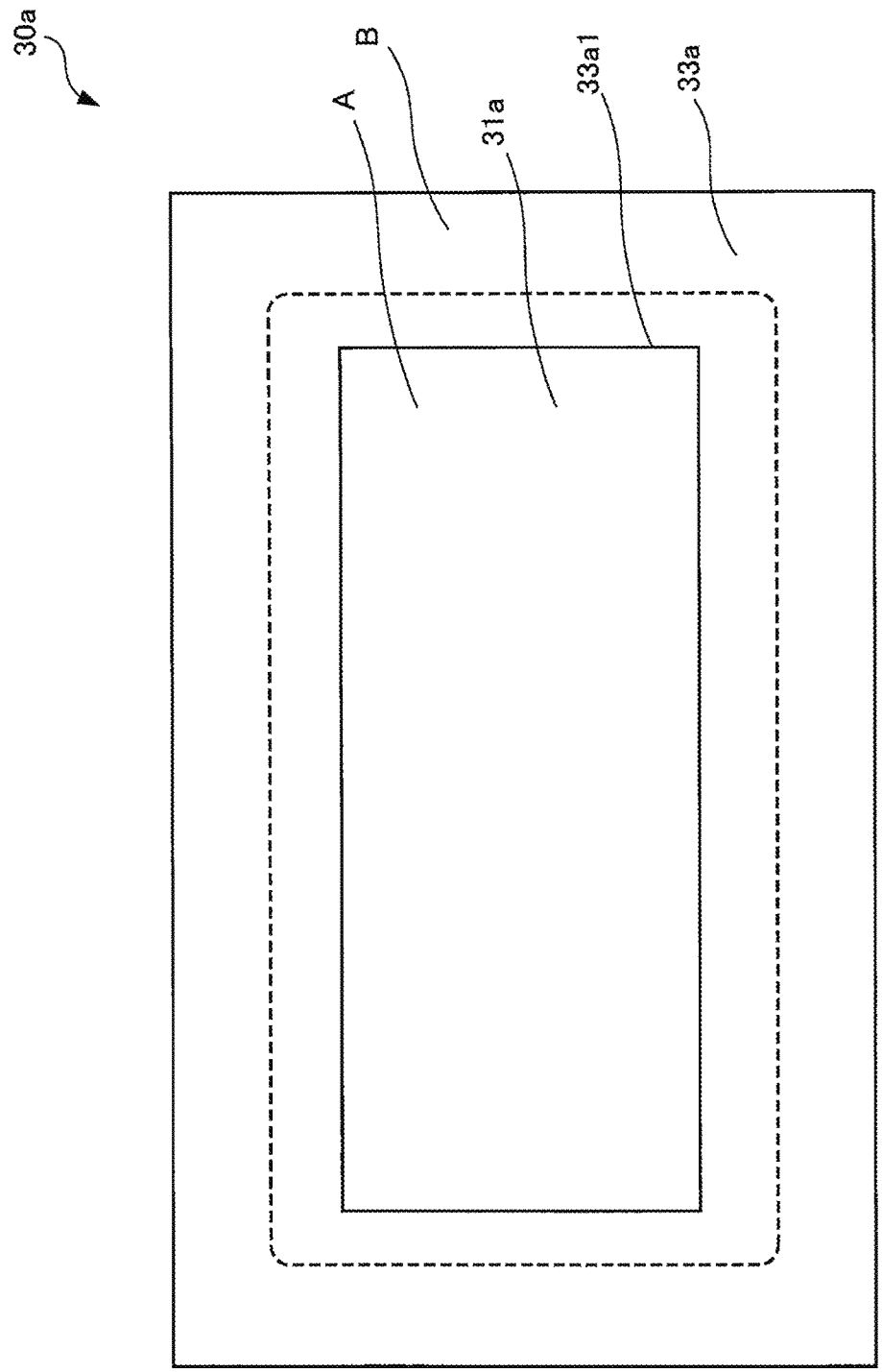
FIG. 5 shows a plan view of a heat dissipating unit of the semiconductor device of Embodiment 2.

As shown in FIG. 4 and FIG. 5, the heat dissipating unit 30a has set on the front surface thereof the mounting region A (the inner side of the dashed line in FIG. 5) where the ceramic circuit substrate 21 is disposed via the solder 24a, and the sealed region B (the outer side of the dashed line in FIG. 5) surrounding the mounting region A and on which the sealing member 25 is bonded. In the flat plate part 31a, an outer peripheral portion of the mounting region A and the sealed region B are dug together. The thickness of the mounting region A of the flat plate part 31a is 1 mm to 10 mm inclusive, and more preferably 2 mm to 5 mm inclusive. Furthermore, the dig depth of the outer peripheral portion of the mounting region A and the sealed region B is 0.5 mm to 8 mm inclusive, and more preferably 1 mm to 3 mm inclusive.

Similar to Embodiment 1, the flat plate part 31a also has the fin part 32 made of the plurality of fins integrally formed on the rear surface thereof. The fin part 32 is formed close to the rear surface of the flat plate part 31a corresponding to the mounting region A. The first metal material forming this type of flat plate part 31a and fin part 32 (together referred to as the primary part) is also, similar to Embodiment 1, made of aluminum or an aluminum alloy.

The embedded part 33a is embedded in the outer peripheral portion of the mounting region A dug in the front surface of the flat plate part 31a and also embedded in the sealed region B. Here, the front surface of the mounting region A of the flat plate part 31a and the front surface of the embedded part 33a are horizontal. The second metal material forming this type of embedded part 33a is copper or a copper alloy, or an MMC, similar to Embodiment 1.

Furthermore, a contact surface 33a1 on the mounting region A side, which is the boundary (inner side boundary) between the side face of the embedded part 33a and the side face of the dug portion of the flat plate part 31a, is positioned below the ceramic circuit substrate 21.

Similar to Embodiment 1, the volumetric mass density of this type of primary part is less than the volumetric mass density of the embedded part 33a, at 2.7 g/cm$^3$ (aluminum or aluminum alloy). The volumetric mass density of the embedded part 33a is 8.9 g/cm$^3$ (copper or copper alloy) or 2.8 g/cm$^3$ (MMC).

In regard to the volume of the heat dissipating unit 30a of the semiconductor device 10a, the primary part makes up 75% of the volume, and the embedded part 33a makes up 25%. Therefore, in terms of the weight ratio, assuming that the weight of the heat dissipating unit 30a made completely of copper is 100, then the weight of the heat dissipating unit 30a when the primary part is made of aluminum or an aluminum alloy and the embedded part 33a is made of copper or a copper alloy would be 48. In this case, the weight of the heat dissipating unit 30a when the embedded part 33a is made of an MMC is 45. Accordingly, the volumetric mass density of the primary part is less than the volumetric mass density of the embedded part 33a, and the volume of the primary part is greater than the volume of the embedded part 33a, which makes it possible to suppress an increase in weight of the heat dissipating unit 30a.

Furthermore, similar to Embodiment 1, it is preferable that the mounting region A of the front surface of the heat dissipating unit 30a be plated with nickel, copper, tin, or the like, in order to solder the ceramic circuit substrate 21. The thickness of the plating is 10 μm to 100 μm inclusive.

This type of semiconductor device 10a can also be manufactured in a similar manner to Embodiment 1.

Accordingly, the semiconductor device 10a has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10a also has the heat dissipating unit 30a. The heat dissipating unit 30a includes the flat plate part 31a and the fin part 32 made of aluminum or an aluminum alloy. Moreover, the semiconductor device includes the embedded part 33a, which is embedded in the front surface of the flat plate part 31a and made of copper or a copper alloy (or an MMC). The sealing member 25 seals the semiconductor elements 22a, 22b, the ceramic circuit substrate 21, and the front surface of the heat dissipating unit 30a. Moreover, the front surface of the heat dissipating unit 30a of the semiconductor device 10a includes the mounting region A on which the ceramic circuit substrate 21 is disposed, and the sealed region B adjacent to the mounting region A and sealed with the sealing member 25. The embedded part 33a is formed in at least the sealed region B, the linear expansion coefficient of the copper or copper alloy (or MMC) is less than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25. In addition, the contact surface 33a1 between the embedded part 33a and the mounting region A side of the flat plate part 31a of the semiconductor device 10a is positioned below the ceramic circuit substrate 21.

In this type of semiconductor device 10a, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10a, the absolute difference of the linear expansion coefficient of the sealing member 25 and the linear expansion coefficient of the sealed region B of the embedded part 33a of the heat dissipating unit 30a sealed by the sealing member 25 is small: less than or equal to 25% of the value of the linear expansion coefficient of the sealing member 25. This suppresses peeling of the sealing member 25 in the sealed region B of the embedded part 33a of the heat dissipating unit 30a.

The primary part, which makes up a large portion of the heat dissipating unit 30a, is made of aluminum or an aluminum alloy, and the embedded part 33a is made of copper or a copper alloy. Thus, it is possible for the heat dissipating unit 30a to be made lightweight.

A difference in the linear expansion coefficients of the flat plate part 31a and of the embedded part 33a would cause deformations, warping, and gaps in the contact surface 33a1. In the semiconductor device 10a, the contact surface 33a1 between the flat plate part 31a and the embedded part 33a is positioned below the ceramic circuit substrate 21. Due to this, stress generated on the contact surface 33a1 resulting from deformations or the like does not progress to the sealing member 25, thus suppressing a reduction in the insulating characteristics of the semiconductor device 10a. The unevenness in the contact surface 33a1 between the flat plate part 31a and the embedded part 33a increases the bonding area of the solder 24a, thus improving bonding strength between the mounting region A of the flat plate part 31a and the ceramic circuit substrate 21.

Accordingly, the semiconductor device 10a makes it possible to lower costs and suppress a decrease in reliability.

Embodiment 3

In Embodiment 3, a semiconductor device in which semiconductor elements, a ceramic circuit substrate, etc. are stored in a case will be described with reference to FIG. 6 and FIG. 7.

Figure 6:
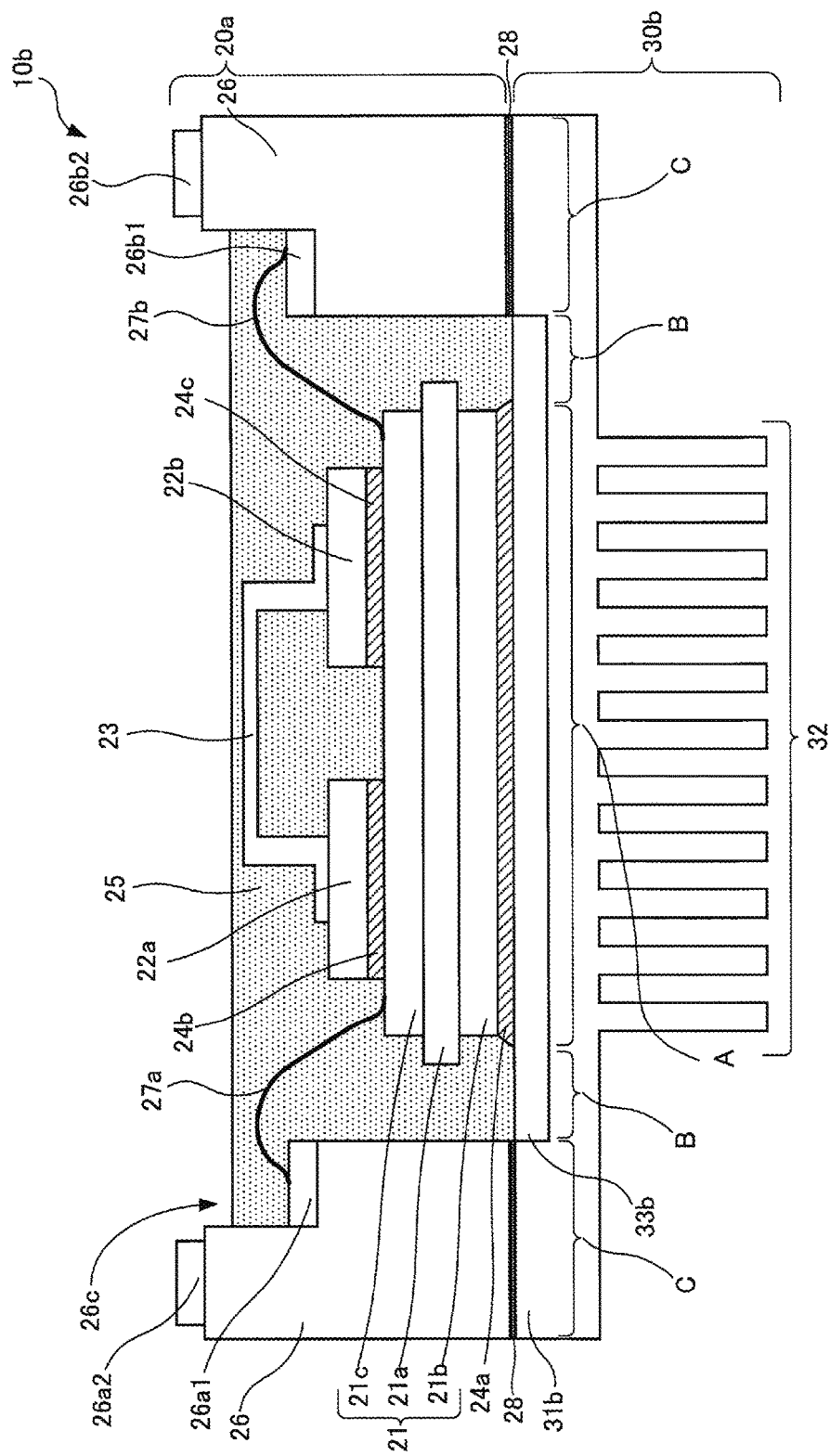
FIG. 6 shows a side cross-sectional view of a semiconductor device of Embodiment 3.
Figure 7:
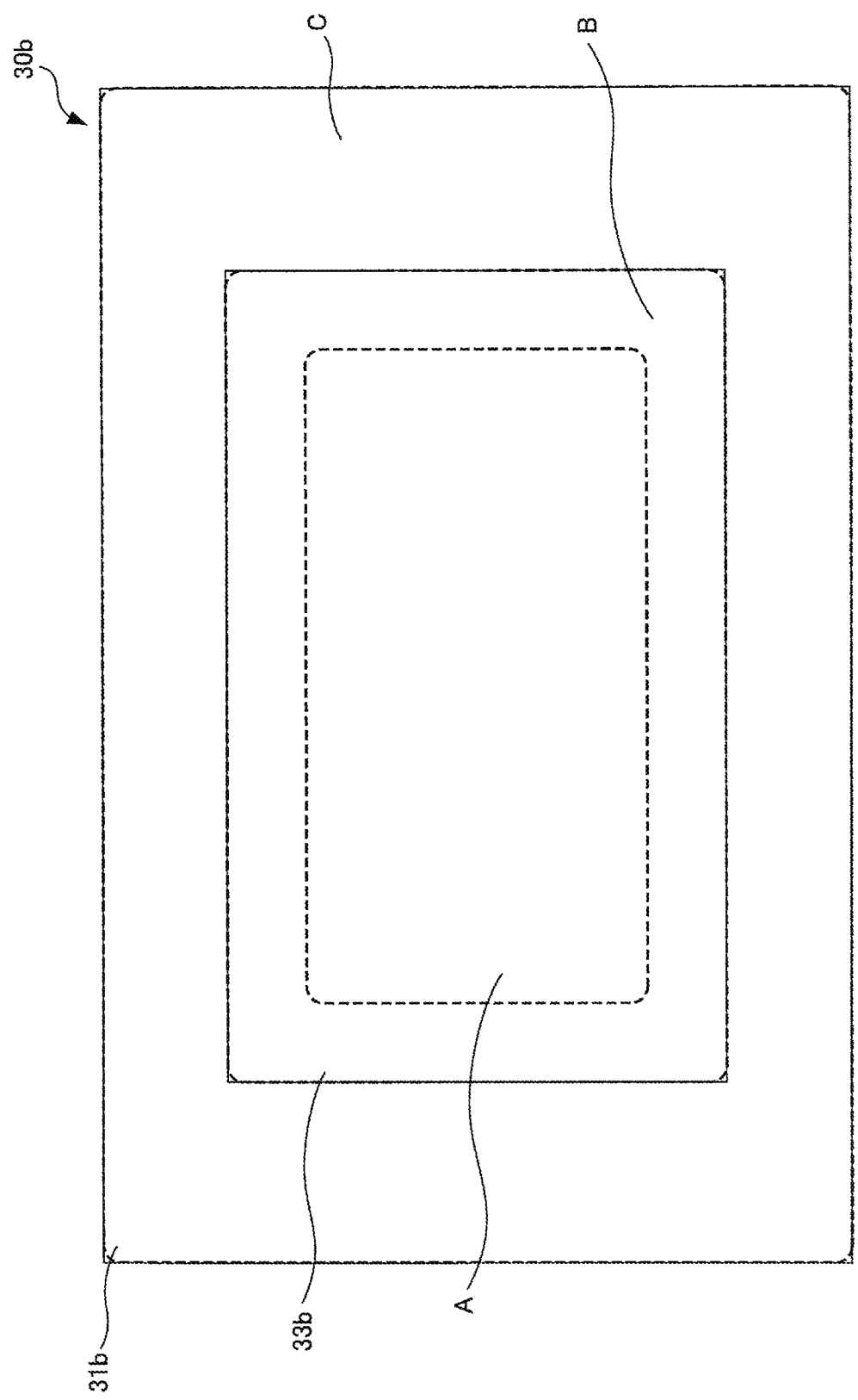
FIG. 7 shows a plan view of a heat dissipating unit of the semiconductor device of Embodiment 3.

FIG. 6 is a side cross-sectional view of the semiconductor device of Embodiment 3, and FIG. 7 is a plan view of a heat dissipating unit of the semiconductor device of Embodiment 3. FIG. 7 shows a plan view of the front surface of the heat dissipating unit 30b (on the side where a semiconductor unit 20a is placed).

In Embodiment 3, the same reference characters are given to configurations that are the same as Embodiments 1 and 2, and explanations of these configurations may be omitted.

The semiconductor device 10b contains the semiconductor unit 20a and the heat dissipating unit 30b.

As shown in FIG. 6, the semiconductor unit 20a has a ceramic circuit substrate 21 (substrate), semiconductor elements 22a and 22b bonded to the front surface of the ceramic circuit substrate 21, and a connection terminal 23 electrically connecting the main electrodes of the semiconductor elements 22a and 22b. The semiconductor unit 20a also has a case 26 for storing these, and bonding wires 27a, 27b for electrically connecting internal connection parts 26a1, 26b1 provided in the case 26 with the circuit layer 21c of the ceramic circuit substrate 21. Cross-sections of sidewalls of the case 26 are depicted in FIG. 6. In the semiconductor device 10b, these are sealed inside the case 26 by the sealing member 25.

The case 26 is provided on the outer periphery of the ceramic circuit substrate 21 etc. and has a box shape that surrounds the lateral sides of the ceramic circuit substrate 21 etc. and that has an opening 26c formed in the center thereof in a plan view. This type of case 26 is made of a thermoplastic resin. The resin can be polyphenylene sulfide (PPS), a polybutylene terephthalate (PBT) resin, a polybutylene succinate (PBS) resin, a polyamide (PA) resin, an acrylonitrile butadiene styrene (ABS) resin, or the like.

Furthermore, this type of case 26 is bonded to the heat dissipating unit 30b via a bonding material 28 of the case 26. This type of bonding material 28 may be coated on the bottom of the case 26, or coated on an peripheral region (arrangement region) C on the front surface of the flat plate part 31b of the heat dissipating unit 30b where the case 26 is bonded. The coating of the bonding material 28 can be done with any known method, such as a screen printing method using a mask, a dispensing method using a syringe, or the like. The bonding material 28 is an epoxy resin-based or silicone rubber-based curable adhesive, for example.

Due to the resin, connection terminals of the case 26 are insert-molded, with the internal connection parts 26a1, 26b1 that are respective ends of the connection terminals being disposed on an inner stepped part, and external connection parts 26a2, 26b2 that are respectively the other ends of the connection terminals being disposed on the upper surface on the outer side. In this type of case 26, prescribed areas of the circuit layer 21c of the ceramic circuit substrate 21 are electrically connected by the bonding wires 27a, 27b to the internal connection parts 26a1, 26b1.

Thus, the semiconductor elements 22a, 22b can output/input signals to/from outside from the external connection parts 26a2, 26b2 via the circuit layer 21c, bonding wires 27a, 27b, and internal connection parts 26a1, 26b1.

Similar to Embodiment 1, the sealing member 25 includes an epoxy resin and a filler in the epoxy resin such as silicon dioxide, aluminum oxide, boron nitride, or aluminum nitride. The linear expansion coefficient of this type of sealing member 25 is 14.0 ppm/° C. to 18.0 ppm/° C. inclusive, based on the amount of the filler. Furthermore, in Embodiment 3, the sealing member 25 can also be gel.

This type of sealing member 25 is injected inside the case 26 from the opening 26c in the case 26. The sealing member 25 injected into the case 26 seals the ceramic circuit substrate 21, semiconductor elements 22a, 22b, connection terminal 23, and bonding wires 27a, 27b on the heat dissipating unit 30b.

Moreover, the heat dissipating unit 30b of the semiconductor device 10b has the flat plate part 31b, fin part 32, and embedded part 33b.

As shown in FIG. 6 and FIG. 7, the heat dissipating unit 30b has set on the front surface thereof the mounting region A where the ceramic circuit substrate 21 is disposed via the solder 24a, the sealed region B surrounding the mounting region A and on which the sealing member 25 is bonded, and the peripheral region C surrounding the outer side of the sealed region B and on which the case 26 is bonded. In the flat plate part 31b, the mounting region A and the sealed region B are dug together. The thickness of the peripheral region C of the flat plate part 31b is 1 mm to 10 mm inclusive, and more preferably 2 mm to 5 mm inclusive. Furthermore, the dig depth of the outer periphery of the mounting region A and the sealed region B is 0.5 mm to 8 mm inclusive, and more preferably 1 mm to 3 mm inclusive.

Similar to Embodiment 1, the flat plate part 31b also has the fin part 32 made of the plurality of fins integrally formed on the rear surface thereof. The fin part 32 is also formed close to the rear surface of the flat plate part 31b corresponding to the mounting region A. The first metal material forming this type of flat plate part 31b and fin part 32

(together referred to as the primary part) is also, similar to Embodiment 1, made of aluminum or an aluminum alloy.

The embedded part 33b is embedded inside the mounting region A and sealed region B dug into the front surface of the flat plate part 31b. At this time, the front surface of the flat plate part 31b and the front surface of the embedded part 33b are horizontal. The second metal material forming this type of embedded part 33b is copper or a copper alloy, or an MMC, similar to Embodiment 1.

Similar to Embodiment 1, the volumetric mass density of this type of primary part is less than the volumetric mass density of the embedded part 33b, at 2.7 g/cm$^3$ (aluminum or aluminum alloy). The volumetric mass density of the embedded part 33b is 8.9 g/cm$^3$ (copper or copper alloy) or 2.8 g/cm$^3$ (MMC).

In regard to the volume of the heat dissipating unit 30b of the semiconductor device 10b, the primary part makes up 67% of the volume, and the embedded part 33b makes up 33%. Therefore, in terms of the weight ratio, assuming that the weight of the heat dissipating unit 30b made completely of copper is 100, then the weight of the heat dissipating unit 30b when the primary part is made of aluminum or an aluminum alloy and the embedded part 33b is made of copper or a copper alloy would be 53. Accordingly, the volumetric mass density of the primary part is less than the volumetric mass density of the embedded part 33b, and the volume of the primary part is greater than the volume of the embedded part 33b, which makes it possible to suppress an increase in weight of the heat dissipating unit 30b.

When manufacturing this type of semiconductor device 10b, first the ceramic circuit substrate 21, semiconductor elements 22a and 22b, and connection terminal 23 are prepared. Then, the heat dissipating unit 30b is prepared, which has the flat plate part 31b, fin part 32, and embedded part 33b that is embedded in the mounting region A and sealed region B dug into the front surface of the flat plate part 31b.

The embedded part 33b of the heat dissipating unit 30b corresponding to the shape of the mounting region A and sealed region B dug into the flat plate part 31b is formed in advance, the embedded part 33b is set in the dug mounting region A and sealed region B, and then the embedded part 33b is integrated with the flat plate part 31b by friction stir welding.

The ceramic circuit substrate 21 is disposed on the mounting region A of the embedded part 33b of the heat dissipating unit 30b via solder paste or a solder plate. The semiconductor elements 22a, 22b are also each disposed on a prescribed region of the circuit layer 21c of the ceramic circuit substrate 21 via solder paste or a solder plate. The connection terminal 23 is also disposed on the main electrodes of the semiconductor elements 22a, 22b via solder paste or a solder plate.

The solder paste or solder plate is heated and melted in this state, and the melted solder is solidified. This adheres the ceramic circuit substrate 21 to the mounting region A of the embedded part 33b of the heat dissipating unit 30b via the solder 24a, and adheres the semiconductor elements 22a, 22b on the ceramic circuit substrate 21 via the solder 24b, 24c. The main electrodes of the semiconductor elements 22a, 22b are electrically connected by the connection terminal 23.

The bonding material 28 is coated on the bottom surface of the case 26 or on the peripheral region C on the front surface of the flat plate part 31b, and then the case 26 is attached to the peripheral region C on the front surface of the flat plate part 31b. At this time, the ceramic circuit substrate 21 etc. is stored in the opening 26c in the case 26 and enclosed.

A bonding tool (not shown) is used to electrically connect prescribed areas of the circuit layer 21c of the ceramic circuit substrate 21 with the internal connection parts 26a1, 26b1 of the case 26 via the bonding wires 27a, 27b.

A sealing material in a melted state is injected into the opening 26c in the case 26 storing the ceramic circuit substrate 21, semiconductor elements 22a, 22b, etc. until the opening 26c is filled. The injected sealing material is sufficiently solidified (thus forming the sealing member 25).

This forms the semiconductor device 10b in which the ceramic circuit substrate 21, semiconductor elements 22a, 22b, connection terminal 23, bonding wires 27a, 27b, and sealed region B of the embedded part 33b of the heat dissipating unit 30b are sealed with the sealing member 25.

Furthermore, similar to Embodiment 1, because the absolute difference of the linear expansion coefficient of the sealing member 25 and the linear expansion coefficient of the embedded part 33b (sealed region B) is less than or equal to approximately 25% of the value of the linear expansion coefficient of the sealing member 25, then it is thought that peeling will not occur between the sealing member 25 and the embedded part 33b.

Accordingly, the semiconductor device 10b has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10b also has the heat dissipating unit 30b. The heat dissipating unit 30b includes the flat plate part 31b and the fin part 32 made of aluminum or an aluminum alloy. The heat dissipating unit 30b is also provided with the embedded part 33b, which is embedded in the front surface of the flat plate part 31b and made of copper or a copper alloy (or an MMC). In addition, the sealing member 25 seals the semiconductor elements 22a, 22b, ceramic circuit substrate 21, and front surface of the heat dissipating unit 30b. Moreover, the front surface of the heat dissipating unit 30b of the semiconductor device 10b includes the mounting region A on which the ceramic circuit substrate 21 is disposed, the sealed region B adjacent to the mounting region A and sealed by the sealing member 25, and the peripheral region C surrounding the outer side of the sealed region B and on which the case 26 is bonded. The embedded part 33b is formed in at least the sealed region B, the linear expansion coefficient of the copper or copper alloy (or MMC) is smaller than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25.

In this type of semiconductor device 10b, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10b, the absolute difference of the linear expansion coefficient of the sealing member 25 and the linear expansion coefficient of the sealed region B of the embedded part 33b of the heat dissipating unit 30b sealed by the sealing member 25 is small: less than or equal to 25% of the value of the linear expansion coefficient of the sealing member 25. This suppresses peeling of the sealing member 25 in the sealed region B of the embedded part 33b of the heat dissipating unit 30b.

The primary part, which makes up a large portion of the heat dissipating unit 30b, is made of aluminum or an aluminum alloy, and the embedded part 33b can be made of copper or a copper alloy. Furthermore, the volumetric mass density of the primary part is less than the volumetric mass density of the embedded part 33b. Thus, it is possible for the heat dissipating unit 30b to be made lightweight.

Moreover, in the semiconductor device 10b, the embedded part 33b made of copper or a copper alloy is provided in the mounting region A in which the ceramic circuit substrate 21 is mounted. This type of embedded part 33b has a high thermal conductivity and excellent heat dissipating characteristics as compared to the primary part which is made of aluminum or an aluminum alloy. Due to this, the semiconductor device 10b has cooling characteristics for the semiconductor elements 22a, 22b that are more improved than the semiconductor device 10 and 10a of Embodiments 1 and 2.

Accordingly, the semiconductor device 10b makes it possible to lower costs and suppress a decrease in reliability.

Embodiment 4

In Embodiment 4, an example will be described in which, in the semiconductor device 10b of Embodiment 3, the contact surface (boundary) between the flat plate part 31b and the embedded part 33b of the heat dissipating unit 30b is positioned below the case.

A semiconductor device 10c of Embodiment 4 will be described using FIG. 8 and FIG. 9.

Figure 8:
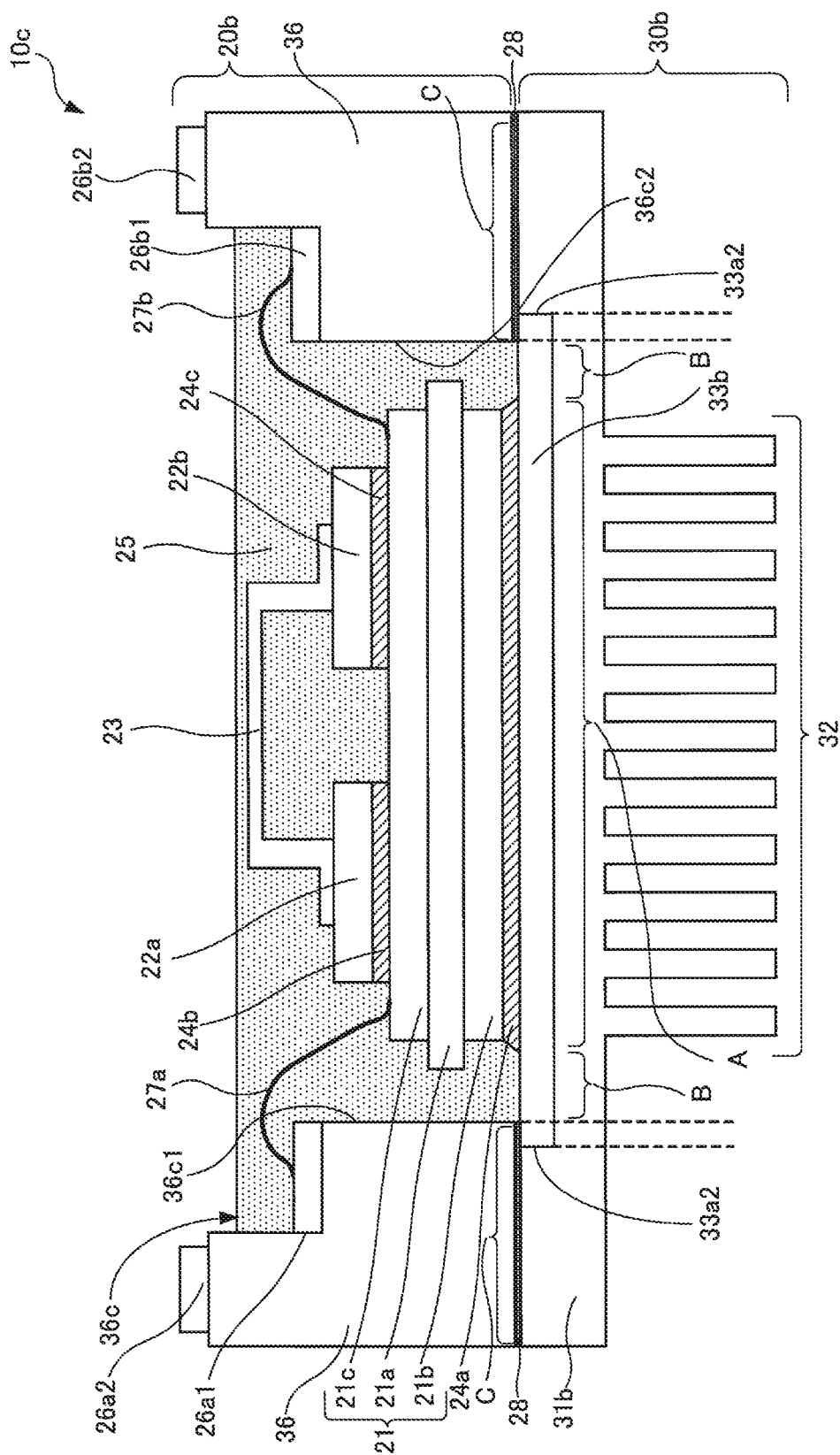
FIG. 8 shows a side cross-sectional view of a semiconductor device of Embodiment 4.
Figure 9:
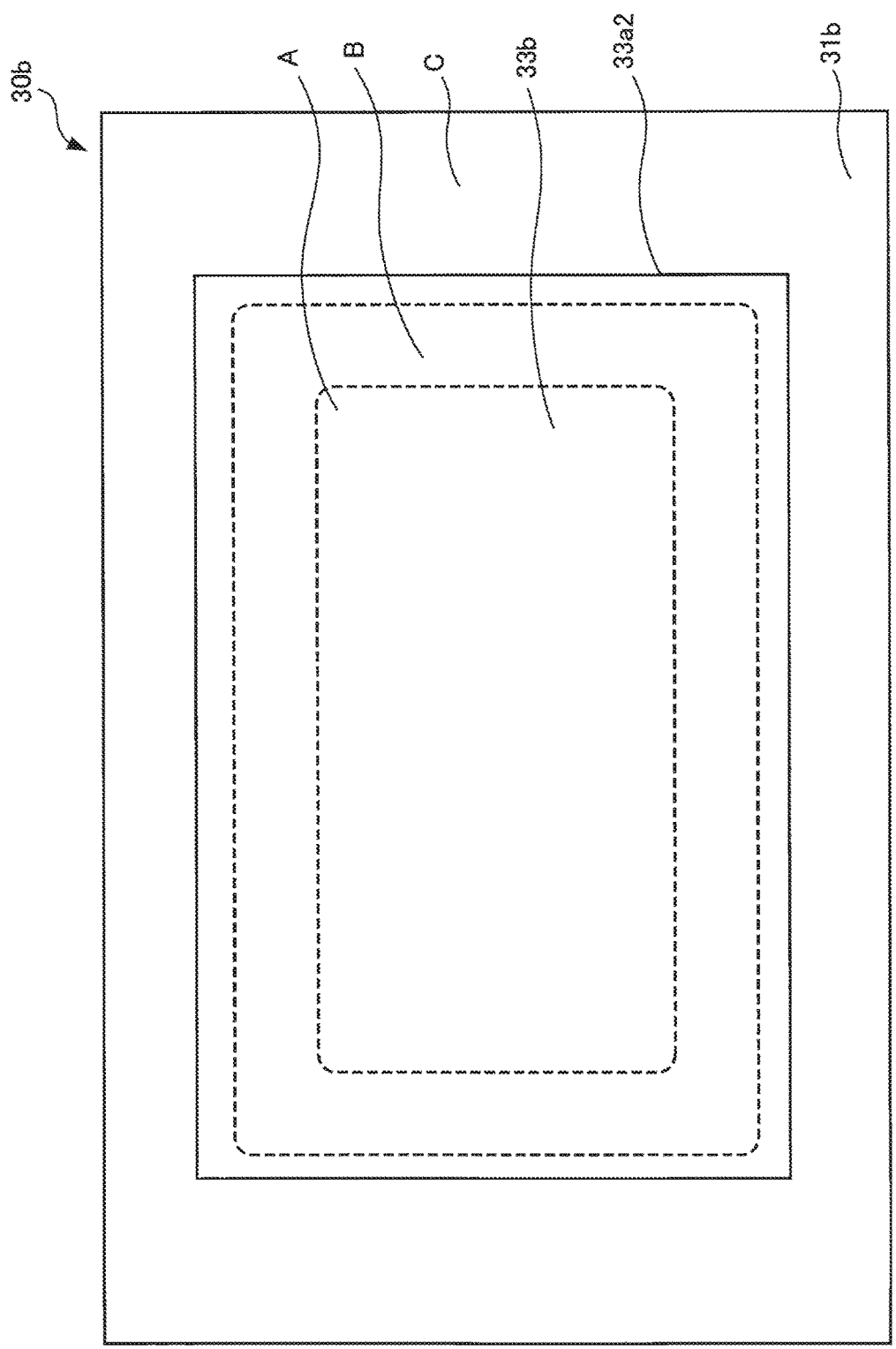
FIG. 9 shows a plan view of a heat dissipating unit of the semiconductor device of Embodiment 4.

FIG. 8 shows a side cross-sectional view of the semiconductor device of Embodiment 4. FIG. 9 shows a plan view of a heat dissipating unit of the semiconductor device of Embodiment 4. FIG. 9 shows a plan view of the front surface of the heat dissipating unit 30b (on the side where a semiconductor unit 20b is placed).

In Embodiment 4, the same reference characters are given to configurations that are the same as Embodiments 1 to 3, and explanations of these configurations may be omitted.

The semiconductor device 10c contains the semiconductor unit 20b and the heat dissipating unit 30b.

As shown in FIG. 8, the semiconductor unit 20b has the ceramic circuit substrate 21 (substrate), semiconductor elements 22a and 22b bonded to the front surface of the ceramic circuit substrate 21, and the connection terminal 23 electrically connecting the main electrodes of the semiconductor elements 22a and 22b. The semiconductor unit 20b also has a case 36 for storing these, and bonding wires 27a, 27b for electrically connecting the internal connection parts 26a1, 26b1 provided in the case 36 with the circuit layer 21c of the ceramic circuit substrate 21. Cross-sections of sidewalls of the case 36 are depicted in FIG. 8. In the semiconductor device 10c, these are sealed inside the case 36 by the sealing member 25.

The case 36 is provided on the outer periphery of the ceramic circuit substrate 21 etc. and has a box shape that surrounds the lateral sides of the ceramic circuit substrate 21 etc. and that has an opening 36c formed in the center thereof in a plan view. The opening 36c in the case 36 has a narrower opening area than the opening 26c in the case 26 of Embodiment 3. In other words, the thickness (in the left-right direction in the drawing) of the case 36 is greater than that of the case 26 of Embodiment 3.

This type of case 36 is also made of a thermoplastic resin. The resin can be polyphenylene sulfide, a polybutylene terephthalate resin, a polybutylene succinate resin, a polyamide resin, an acrylonitrile butadiene styrene resin, or the like.

Furthermore, this type of case 36 is also bonded on the peripheral region C of the heat dissipating unit 30b via the bonding material 28. This type of bonding material 28 may be coated on the bottom of the case 36, or coated on the peripheral region C of the front surface of the flat plate part 31b of the heat dissipating unit 30b. The coating of the bonding material 28 can be done with any known method, such as a screen printing method using a mask, a dispensing method using a syringe, or the like.

Due to the resin, the connection terminals of the case 36 are insert-molded, with the internal connection parts 26a1, 26b1 that are respective ends of the connection terminals being disposed on the inner stepped part, and the external connection parts 26a2, 26b2 that are respectively the other ends of the connection terminals being disposed on the upper surface on the outer side. In this type of case 36, prescribed areas of the circuit layer 21c of the ceramic circuit substrate 21 are electrically connected by the bonding wires 27a, 27b to the internal connection parts 26a1, 26b1. Thus, the semiconductor elements 22a, 22b can output/input signals to/from outside from the external connection parts 26a2, 26b2 via the circuit layer 21c, bonding wires 27a, 27b, and internal connection parts 26a1, 26b1.

Furthermore, similar to Embodiment 3, the heat dissipating unit 30b has the flat plate part 31b, fin part 32, and embedded part 33b.

However, as already described, the thickness (in the left-right direction in FIG. 8) of the case 36 is greater than that of the case 26 of Embodiment 3. Therefore, as the peripheral region C (outside the outer dashed line in FIG. 9) becomes wider, the sealed region B (the region between the inner dashed line and outer dashed line in FIG. 9) becomes narrower. Accordingly, the mounting region A, sealed region B, and inner periphery of the peripheral region C (all inside the solid line 33a2 in FIG. 9) of the front surface of the flat plate part 31b are dug and then the embedded part 33b is embedded.

Moreover, similar to Embodiment 3, the volumetric mass density of this type of flat plate part 31b and fin part 32 (together referred to as the primary part) is less than the volumetric mass density of the embedded part 33b, at 2.7 g/cm$^3$ (aluminum or aluminum alloy). The volumetric mass density of the embedded part 33b is 8.9 g/cm$^3$ (copper or copper alloy) or 2.8 g/cm$^3$ (MMC).

In regard to the volume of the heat dissipating unit 30b of the semiconductor device 10c, the primary part makes up 55% of the volume, and the embedded part 33b makes up 45%. Therefore, in terms of the weight ratio, assuming that the weight of the heat dissipating unit 30b made completely of copper is 100, then the weight of the heat dissipating unit 30b when the primary part is made of aluminum or an aluminum alloy and the embedded part 33b is made of copper or a copper alloy would be 62.

In addition, it is possible to perform a plating treatment on the peripheral region C with a material having excellent corrosion resistance. Examples of such a material include aluminum, nickel, titanium, chromium, molybdenum, tantalum, niobium, tungsten, vanadium, bismuth, zirconium, hafnium, gold, platinum, palladium, or an alloy containing at least one of these. An oxide film may also be formed by the plating treatment. Applying this type of plating treatment to the peripheral region C makes it possible to improve corrosion resistance and prevent wetting of the solder 24a. Thus, the case 36 can be suitably attached to the peripheral region C via the bonding material 28. Scribing could also be performed instead of the plating treatment in order to prevent flowing of the solder 24a. However, scribing creates dust, and there is a risk that the dust could cause the semiconductor device 10c to malfunction. The plating treatment does not cause this type of problem.

This type of semiconductor device 10c can also be manufactured in a similar manner to Embodiment 3.

Accordingly, the semiconductor device 10c has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10c also has the heat dissipating unit 30b. The heat dissipating unit 30b includes the flat plate part 31b and the fin part 32 made of aluminum or an aluminum alloy. The heat dissipating unit 30b is also provided with the embedded part 33b, which is embedded in the front surface of the flat plate part 31b and made of copper or a copper alloy (or an MMC). In addition, the sealing member 25 seals the semiconductor elements 22a, 22b, ceramic circuit substrate 21, and front surface of the heat dissipating unit 30b. Moreover, the front surface of the heat dissipating unit 30b of the semiconductor device 10c includes the mounting region A on which the ceramic circuit substrate 21 is disposed, the sealed region B adjacent to the mounting region A and sealed by the sealing member 25, and the peripheral region C surrounding the outer side of the sealed region B and on which the case 36 is bonded. The embedded part 33b is formed in at least the sealed region B, the linear expansion coefficient of the copper or copper alloy (or MMC) is smaller than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25. Inner wall surfaces 36c1, 36c2 of the opening 36c in the case 36 of the semiconductor device 10c are positioned on the inner side from a contact surface 33a2, which is the boundary (outer boundary) between the embedded part 33b and flat plate part 31b. In other words, the contact surface 33a2 of the embedded part 33b is positioned below the case 36.

In this type of semiconductor device 10c, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10c, the absolute difference of the linear expansion coefficient of the sealing member 25 and the linear expansion coefficient of the sealed region B of the embedded part 33b of the heat dissipating unit 30b sealed by the sealing member 25 is small: less than or equal to 25% of the value of the linear expansion coefficient of the sealing member 25. This suppresses peeling of the sealing member 25 in the sealed region B of the embedded part 33b of the heat dissipating unit 30b.

The primary part, which makes up a large portion of the heat dissipating unit 30b, is made of aluminum or an aluminum alloy, and the embedded part 33b can be made of copper or a copper alloy. Thus, it is possible for the heat dissipating unit 30b to be made lightweight.

In the semiconductor device 10c, the case 36 is thicker than the case 26 of the semiconductor device 10b (see FIG. 6) in Embodiment 3. Meanwhile, it is also possible, in the semiconductor device 10c, to widen the area (the length in the left-right direction of the drawing) of the embedded part 33b of the semiconductor device 10b in Embodiment 3 so as to position the contact surface 33a2 between the embedded part 33b and flat plate part 31b below the case 26. In regard to the volume of the heat dissipating unit 30b of the semiconductor device 10c in this case, the primary part would make up 55% of the volume, and the embedded part 33b would make up 45%, for example. Therefore, in terms of the weight ratio, assuming that the weight of the heat dissipating unit 30b made completely of copper is 100, then the weight of the heat dissipating unit 30 when the primary part is made of aluminum or an aluminum alloy and the embedded part 33b is made of copper or a copper alloy would be 62. Accordingly, the volumetric mass density of the primary part is less than the volumetric mass density of the embedded part 33b, and the volume of the primary part is greater than the volume of the embedded part 33b, which makes it possible to suppress an increase in weight of the heat dissipating unit 30b.

Moreover, in the semiconductor device 10c as well, the embedded part 33b made of copper or a copper alloy is provided in the mounting region A in which the ceramic circuit substrate 21 is disposed. This type of embedded part 33b has a high thermal conductivity and excellent heat dissipating characteristics as compared to the primary part, which is made of aluminum or an aluminum alloy. Due to this, the semiconductor device 10c has cooling characteristics for the semiconductor elements 22a, 22b that are more improved than the semiconductor device 10 of Embodiment 1.

A difference in the linear expansion coefficients of the flat plate part 31b and of the embedded part 33b would cause deformations, warping, and gaps in the contact surface 33a2. In the semiconductor device 10c, the contact surface 33a2 between the flat plate part 31b and the embedded part 33b is positioned below the case 36. Due to this, stress generated on the contact surface 33a2 resulting from deformations or the like does not progress to the sealing member 25, thus suppressing a reduction in the insulating characteristics of the semiconductor device 10c. The unevenness in the contact surface 33a2 between the flat plate part 31b and the embedded part 33b increases the bonding area of the bonding material 28, thus improving bonding strength between the peripheral region C of the flat plate part 31b and the case 36.

Accordingly, the semiconductor device 10c makes it possible to lower costs and suppress a decrease in reliability.

Embodiment 5

In Embodiment 5, an example is described in which a case is attached to the semiconductor device 10 of Embodiment 1.

A semiconductor device 10d of Embodiment 5 will be described using FIG. 10.

Figure 10:
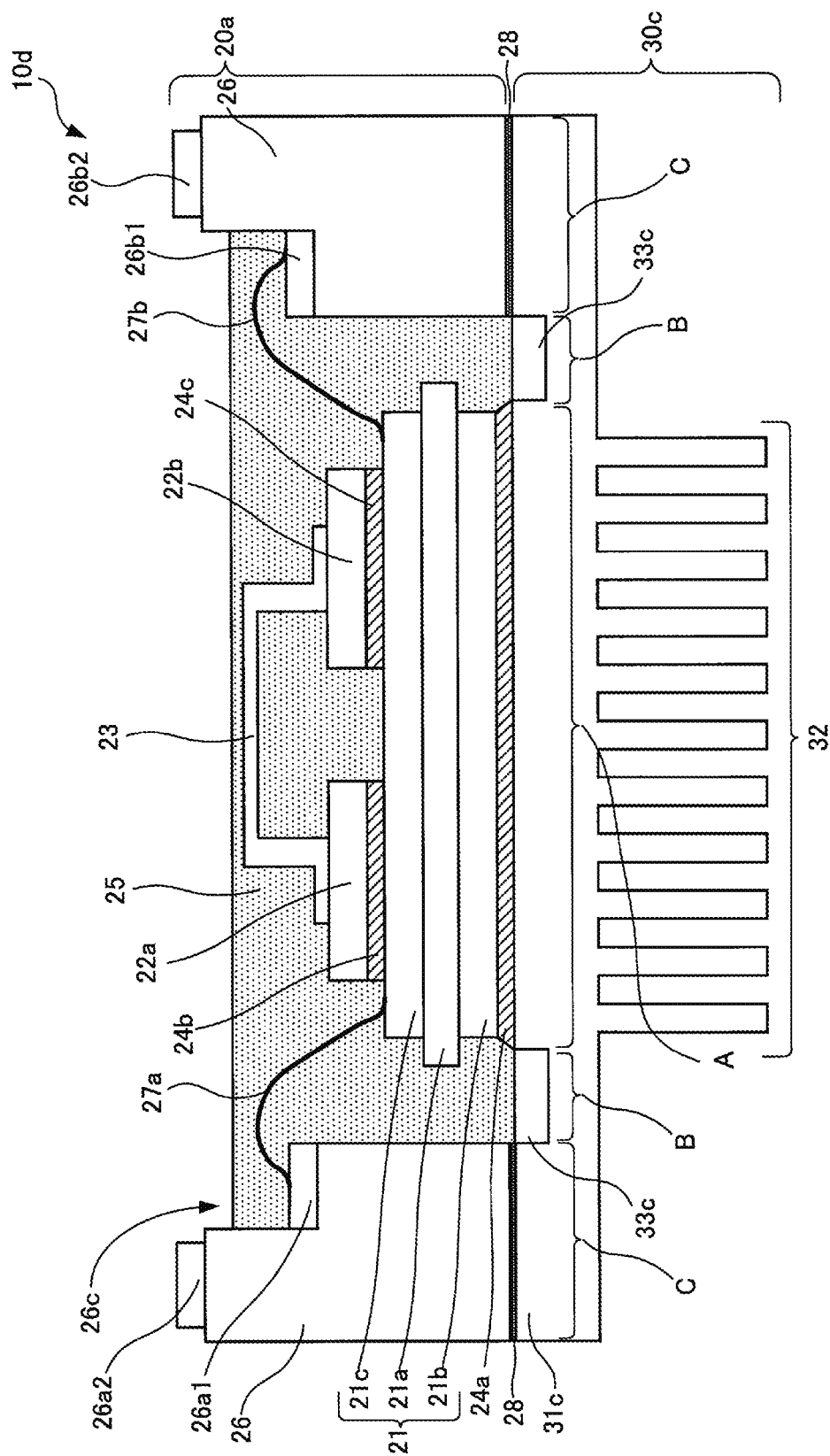
FIG. 10 shows a side cross-sectional view of a semiconductor device of Embodiment 5.

FIG. 10 shows a side cross-sectional view of the semiconductor device of Embodiment 5.

In Embodiment 5, the same reference characters are given to configurations that are the same as Embodiments 1 to 4, and explanations of these configurations may be omitted.

The semiconductor device 10d contains the semiconductor unit 20a and a heat dissipating unit 30c.

The heat dissipating unit 30c has a flat plate part 31c and the fin part 32.

As shown in FIG. 10, the heat dissipating unit 30c has set on the front surface thereof the mounting region A where the ceramic circuit substrate 21 is disposed via the solder 24a, the sealed region B surrounding the mounting region A and on which the sealing member 25 is bonded, and the peripheral region C surrounding the outer side of the sealed region B and on which the case 26 is bonded. The sealed region B is dug in the flat plate part 31c. The thickness of the portion of the flat plate part 31c that is not dug is 1 mm to 10 mm inclusive, and more preferably 2 mm to 5 mm inclusive. Furthermore, the dig depth of the sealed region B is 0.5 mm to 8 mm inclusive, and more preferably 1 mm to 3 mm inclusive.

Similar to Embodiment 1, the flat plate part 31c also has the fin part 32 made of the plurality of fins integrally formed on the rear surface thereof. The fin part 32 is also formed close to the rear surface of the flat plate part 31c corresponding to the mounting region A. The first metal material forming this type of flat plate part 31c and fin part 32 (together referred to as the primary part) is also, similar to Embodiment 1, made of aluminum or an aluminum alloy.

The embedded part 33c is embedded inside the sealed region B that is dug into the front surface of the flat plate part 31c. At this time, the front surface of the flat plate part 31c and the front surface of the embedded part 33c are horizontal. The second metal material forming this type of embedded part 33c is copper or a copper alloy, or an MMC, similar to Embodiment 1.

Moreover, similar to Embodiment 1, the volumetric mass density of this type of flat plate part 31c and fin part 32 is less than the volumetric mass density of the embedded part 33c, at 2.7 g/cm$^3$ (aluminum or aluminum alloy). The volumetric mass density of the embedded part 33c is 8.9 g/cm$^3$ (copper or copper alloy) or 2.8 g/cm$^3$ (MMC).

In regard to the volume of the heat dissipating unit 30c of the semiconductor device 10d, the primary part makes up 90% of the volume, and the embedded part 33c makes up 10%. Therefore, in terms of the weight ratio, assuming that the weight of the heat dissipating unit 30c made completely of copper is 100, then the weight of the heat dissipating unit 30c when the primary part is made of aluminum or an aluminum alloy and the embedded part 33c is made of copper or a copper alloy would be 37. Accordingly, the volumetric mass density of the primary part is less than the volumetric mass density of the embedded part 33c, and the volume of the primary part is greater than the volume of the embedded part 33c, which makes it possible to suppress an increase in weight of the heat dissipating unit 30c.

Furthermore, similar to Embodiment 1, it is preferable that the mounting region A of the front surface of the heat dissipating unit 30c be plated with nickel, copper, tin, or the like, in order to solder the ceramic circuit substrate 21. The thickness of the plating is 10 μm to 100 μm inclusive.

This type of semiconductor device 10d can also be manufactured in a similar manner to Embodiment 3.

Accordingly, the semiconductor device 10d has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10d also has the heat dissipating unit 30c. The heat dissipating unit 30c includes the flat plate part 31c and the fin part 32 made of aluminum or an aluminum alloy. The heat dissipating unit 30c is also provided with the embedded part 33c, which is embedded in the front surface of the flat plate part 31c and made of copper or a copper alloy (or an MMC). In addition, the sealing member 25 seals the semiconductor elements 22a, 22b, ceramic circuit substrate 21, and front surface of the heat dissipating unit 30c. Moreover, the front surface of the heat dissipating unit 30c of the semiconductor device 10d includes the mounting region A on which the ceramic circuit substrate 21 is disposed, the sealed region B adjacent to the mounting region A and sealed by the sealing member 25, and the peripheral region C surrounding the outer side of the sealed region B and on which the case 26 is bonded. The embedded part 33c is formed in at least the sealed region B, the linear expansion coefficient of the copper or copper alloy (or MMC) is smaller than the linear expansion coefficient of the aluminum or aluminum alloy, and the absolute difference in the linear expansion coefficient of the copper or copper alloy (or MMC) and the linear expansion coefficient of the sealing member 25 is less than or equal to 25% of the value of the linear expansion coefficient of the sealing member 25.

In this type of semiconductor device 10d, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10d, the absolute difference of the linear expansion coefficient of the sealing member 25 and the linear expansion coefficient of the sealed region B of the embedded part 33c of the heat dissipating unit 30c sealed by the sealing member 25 is small: less than or equal to 25% of the value of the linear expansion coefficient of the sealing member 25. This suppresses peeling of the sealing member 25 in the sealed region B of the embedded part 33c of the heat dissipating unit 30c.

The primary part, which makes up a large portion of the heat dissipating unit 30c, is made of aluminum or an aluminum alloy, and the embedded part 33c can be made of copper or a copper alloy. Thus, it is possible for the heat dissipating unit 30c to be made lightweight.

Accordingly, the semiconductor device 10d makes it possible to lower costs and suppress a decrease in reliability.

Embodiment 6

In Embodiment 6, an example will be described in which, in the semiconductor device 10d of Embodiment 5, contact surfaces between the flat plate part 31c of the heat dissipating unit 30c and the embedded part 33c are positioned below both the case 26 and the ceramic circuit substrate 21.

A semiconductor device 10e of Embodiment 6 will be described using FIG. 11 and FIG. 12.

Figure 11:
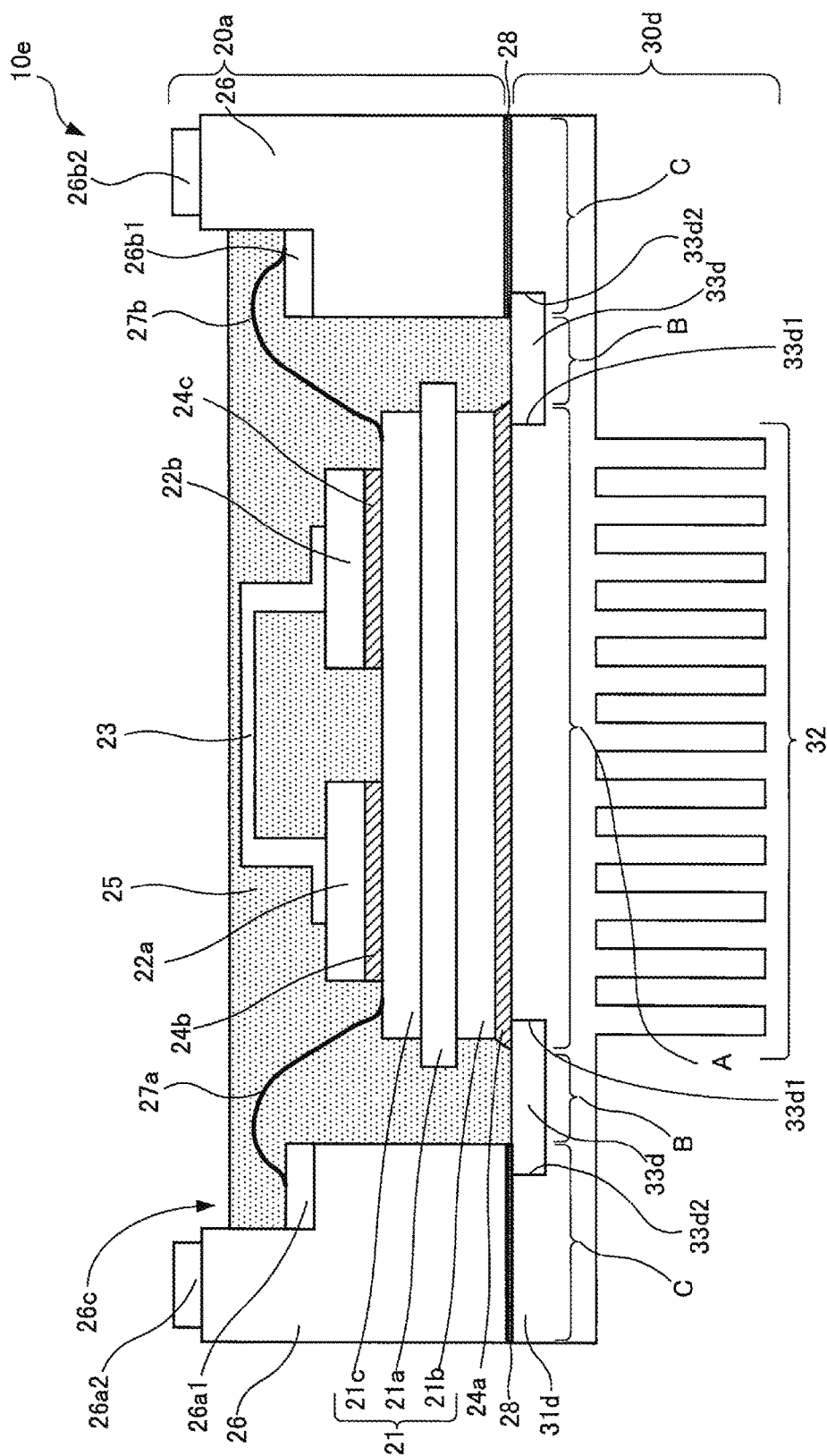
FIG. 11 shows a side cross-sectional view of a semiconductor device of Embodiment 6.

FIG. 11 shows a side cross-sectional view of the semiconductor device of Embodiment 6. FIG. 12 shows a plan view of a heat dissipating unit of the semiconductor device of Embodiment 6. FIG. 12 shows a plan view of the front surface of the heat dissipating unit 30d (on the side where the semiconductor unit 20a is placed).

In Embodiment 6, the same reference characters are given to configurations that are the same as Embodiments 1 to 5, and explanations of these configurations may be omitted.

The semiconductor device 10e contains the semiconductor unit 20a and the heat dissipating unit 30d.

The heat dissipating unit 30d has a flat plate part 31d, the fin part 32, and an embedded part 33d.

Figure 12:
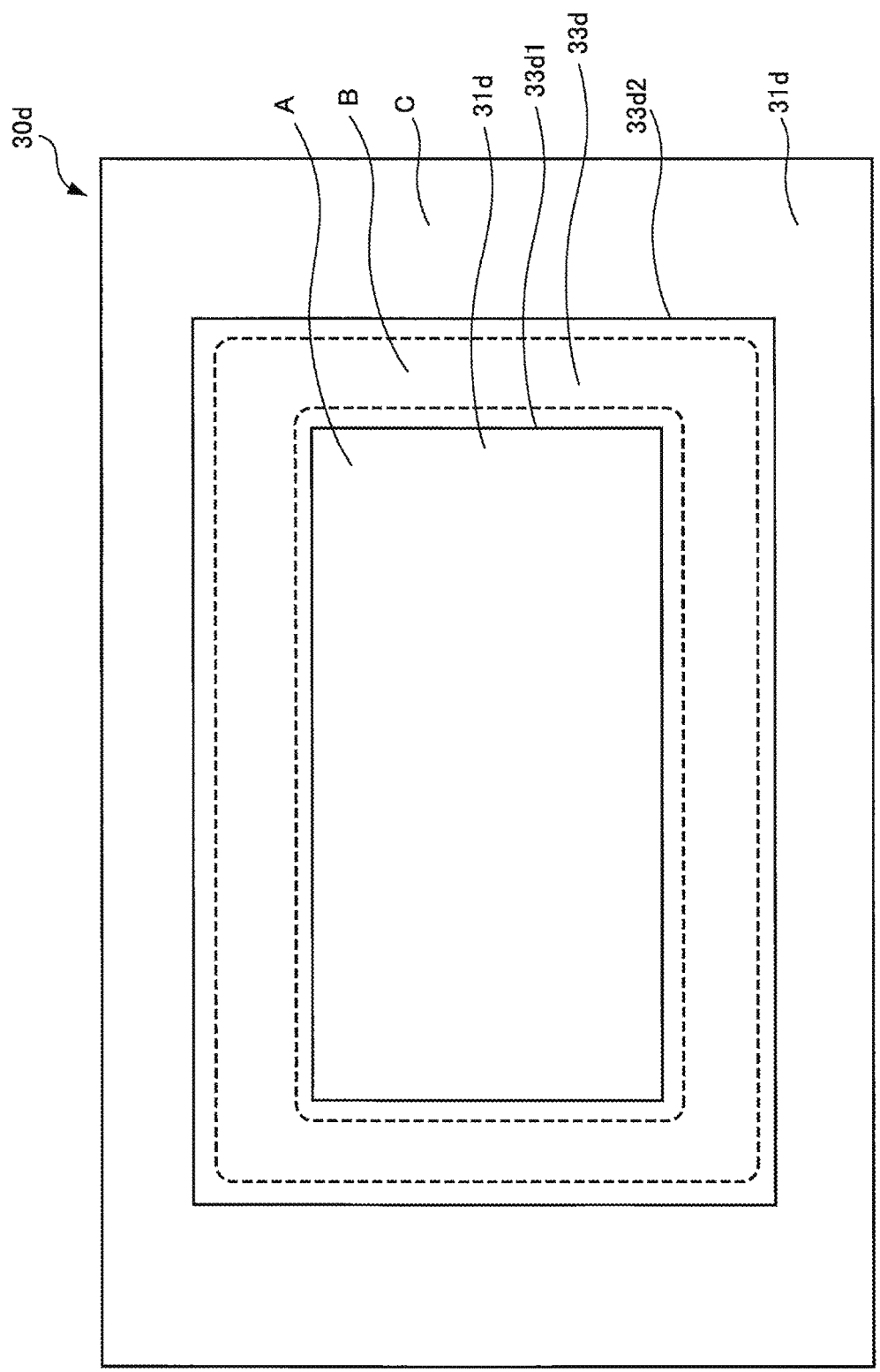
FIG. 12 shows a plan view of a heat dissipating unit of the semiconductor device of Embodiment 6.

As shown in FIG. 11 and FIG. 12, the heat dissipating unit 30d has set on the front surface thereof the mounting region A (the region on the inside of the inner dashed line in FIG. 12) where the ceramic circuit substrate 21 is disposed via the solder 24a, the sealed region B (the region between the inner dashed line and outer dashed line in FIG. 12) surrounding the mounting region A, and the peripheral region C (the region outside the outer dashed line in FIG. 12) on the outer side of the sealed region B. In the flat plate part 31d, the outer periphery of the mounting region A, the sealed region B, and the outer periphery of the peripheral region C are dug (together referred to as the region between a contact surface 33d1 and contact surface 33d2 in FIG. 12). The thickness of the portion of the flat plate part 31d that is not dug is 1 mm to 10 mm inclusive, and more preferably 2 mm to 5 mm inclusive. Furthermore, the dig depth of the sealed region B is 0.5 mm to 8 mm inclusive, and more preferably 1 mm to 3 mm inclusive.

Similar to Embodiment 1, the flat plate part 31d also has the fin part 32 made of the plurality of fins integrally formed on the rear surface thereof. The fin part 32 is formed close to the rear surface of the flat plate part 31d corresponding to the mounting region A. The first metal material forming this type of flat plate part 31d and fin part 32 (together referred to as the primary part) is also, similar to Embodiment 1, made of aluminum or an aluminum alloy.

The embedded part 33d is embedded in the outer periphery of the mounting region A, the sealed region B, and the outer periphery of the peripheral region C dug in the front surface of the flat plate part 31d. At this time, the front surface of the flat plate part 31d and the front surface of the embedded part 33d are horizontal. The second metal material forming this type of embedded part 33d is copper or a copper alloy, or an MMC, similar to Embodiment 1.

Similar to Embodiment 1, the volumetric mass density of this type of primary part is less than the volumetric mass density of the embedded part 33d, at 2.7 g/cm$^3$ (aluminum or aluminum alloy). The volumetric mass density of the embedded part 33d is 8.9 g/cm$^3$ (copper or copper alloy) or 2.8 g/cm$^3$ (MMC).

Furthermore, the contact surface 33d1 of the boundary (inner edge) on the mounting region A side between the embedded part 33d and the flat plate part 31d is positioned below the ceramic circuit substrate 21. The contact surface 33d2 of the boundary (outer edge) on the peripheral region C side between the embedded part 33d and the flat plate part 31d is positioned below the case 26.

In regard to the volume of the heat dissipating unit 30d of the semiconductor device 10e, the primary part makes up 75% of the volume, and the embedded part 33d makes up 25%. Therefore, in terms of the weight ratio, assuming that the weight of the heat dissipating unit 30d made completely of copper is 100, then the weight of the heat dissipating unit 30d when the primary part is made of aluminum or an aluminum alloy and the embedded part 33d is made of copper or a copper alloy would be 48. In this case, the weight of the heat dissipating unit 30d when the embedded part 33d is made of an MMC is 45. Accordingly, the volumetric mass density of the primary part is less than the volumetric mass density of the embedded part 33d, and the volume of the primary part is greater than the volume of the embedded part 33d, which makes it possible to suppress an increase in weight of the heat dissipating unit 30d.

Furthermore, similar to Embodiment 1, it is preferable that the mounting region A of the front surface of the heat dissipating unit 30d be plated with nickel, copper, tin, or the like, in order to solder the ceramic circuit substrate 21. The thickness of the plating is 10 µm to 100 µm inclusive.

In addition, it is possible to perform a plating treatment on the peripheral region C of this type of heat dissipating unit 30d with a material having excellent corrosion resistance. Examples of such a material include aluminum, nickel, titanium, chromium, molybdenum, tantalum, niobium, tungsten, vanadium, bismuth, zirconium, hafnium, gold, platinum, palladium, or an alloy containing at least one of these. An oxide film may also be formed by the plating treatment. Applying this type of plating treatment to the peripheral region C makes it possible to improve corrosion resistance and prevent wetting of the solder 24a. Thus, the case 26 can be suitably attached to the peripheral region C via the bonding material 28. Scribing could also be performed instead of the plating treatment in order to prevent flowing of the solder. However, scribing creates dust, and there is a risk that the dust could cause the semiconductor device 10e to malfunction. The plating treatment does not cause this type of problem.

This type of semiconductor device 10e can also be manufactured in a similar manner to Embodiment 3.

Accordingly, the semiconductor device 10e has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10e also has the heat dissipating unit 30d. The heat dissipating unit 30d includes the flat plate part 31d and the fin part 32 made of aluminum or an aluminum alloy. The heat dissipating unit 30d is also provided with the embedded part 33d, which is embedded in the front surface of the flat plate part 31d and made of copper or a copper alloy (or an MMC). In addition, the sealing member 25 seals the semiconductor elements 22a, 22b, ceramic circuit substrate 21, and front surface of the heat dissipating unit 30d. Moreover, the front surface of the heat dissipating unit 30d of the semiconductor device 10e includes the mounting region A on which the ceramic circuit substrate 21 is disposed, the sealed region B adjacent to the mounting region A and sealed by the sealing member 25, and the peripheral region C surrounding the outer side of the sealed region B and on which the case 26 is bonded. The embedded part 33d is formed in at least the sealed region B, the linear expansion coefficient of the copper or copper alloy (or MMC) is smaller than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25. In addition, in the semiconductor device 10e, the contact surface 33d1 on the mounting region A side of the embedded part 33d is positioned below the ceramic circuit substrate 21, and the contact surface 33d2 on the peripheral region C side of the embedded part 33d is positioned below the case 26.

In this type of semiconductor device 10e, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10e, the absolute difference in the linear expansion coefficient of the sealing member 25 and the linear expansion coefficient of the sealed region B of the embedded part 33d of the heat dissipating unit 30d sealed by the sealing member 25 is small: less than or equal to 25% of the value of the linear expansion coefficient of the sealing member 25. This suppresses peeling of the sealing member 25 in the sealed region B of the embedded part 33d of the heat dissipating unit 30d.

The primary part, which makes up a large portion of the heat dissipating unit 30d, is made of aluminum or an aluminum alloy, and the embedded part 33d can be made of copper or a copper alloy (or an MMC). Thus, it is possible for the heat dissipating unit 30d to be made lightweight.

A difference in the linear expansion coefficients of the flat plate part 31d and of the embedded part 33d would cause deformations, warping, and gaps in the contact surfaces 33d1, 33d2. In the semiconductor device 10e, the contact surfaces 33d1, 33d2 between the flat plate part 31d and embedded part 33d are positioned below both the ceramic circuit substrate 21 and the case 26. Due to this, stress generated on the contact surfaces 33d1, 33d2 resulting from deformations or the like does not progress to the sealing member 25, thus suppressing a reduction in the insulating characteristics of the semiconductor device 10e. The unevenness in the contact surface 33d2 between the flat plate part 31d and the embedded part 33d increases the bonding area of the bonding material 28, thus improving bonding strength between the peripheral region C of the flat plate part 31d and the case 26.

Accordingly, the semiconductor device 10e makes it possible to lower costs and suppress a decrease in reliability.

Embodiment 7

In Embodiment 7, an example will be described in which, in the semiconductor device 10b of Embodiment 3, protrusions have been formed in the sealed region B of the heat dissipating unit 30b.

A semiconductor device 10f of Embodiment 7 will be described using FIG. 13 and FIG. 14.

Figure 13:
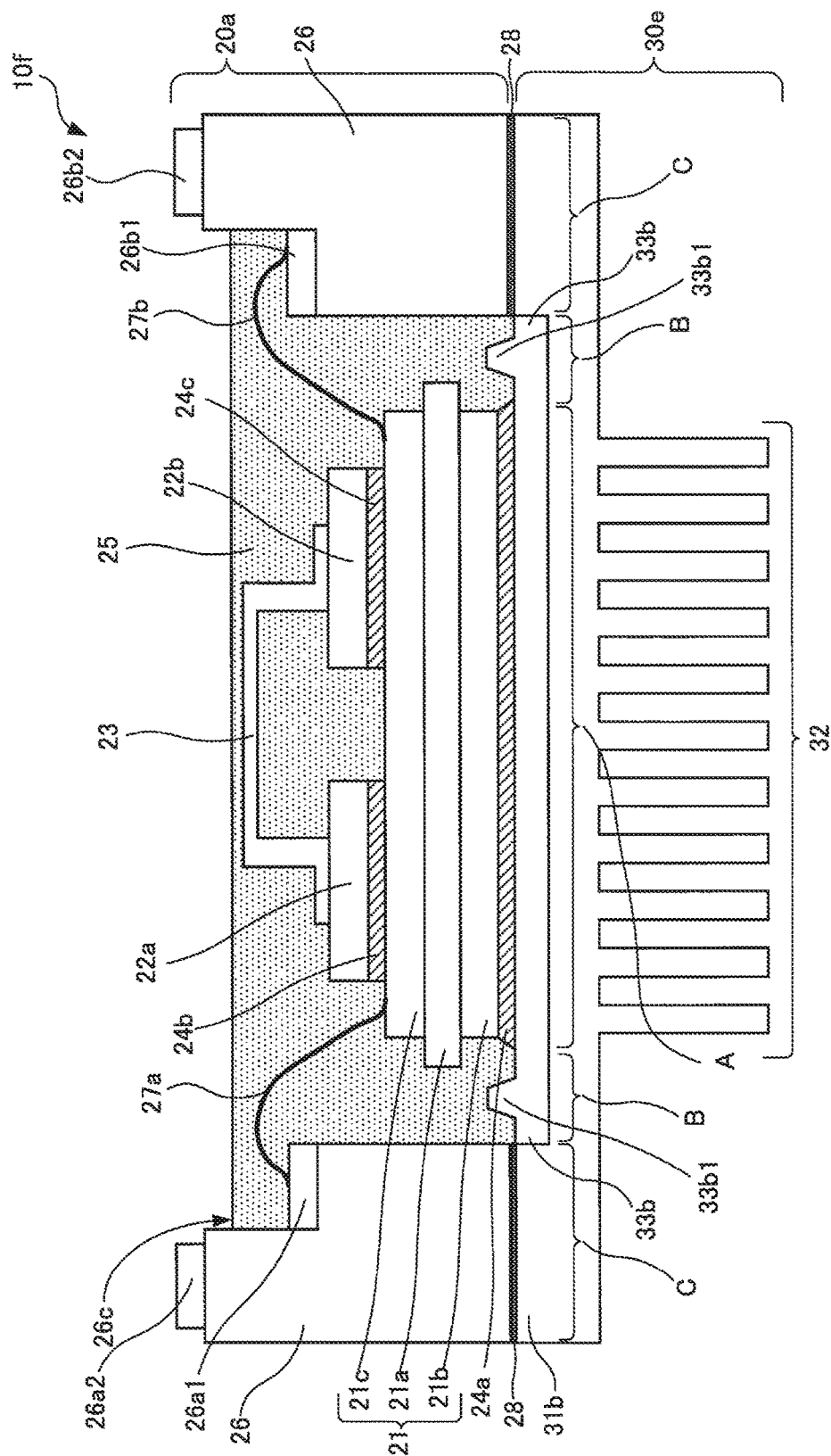
FIG. 13 shows a side cross-sectional view of a semiconductor device of Embodiment 7.
Figure 14:
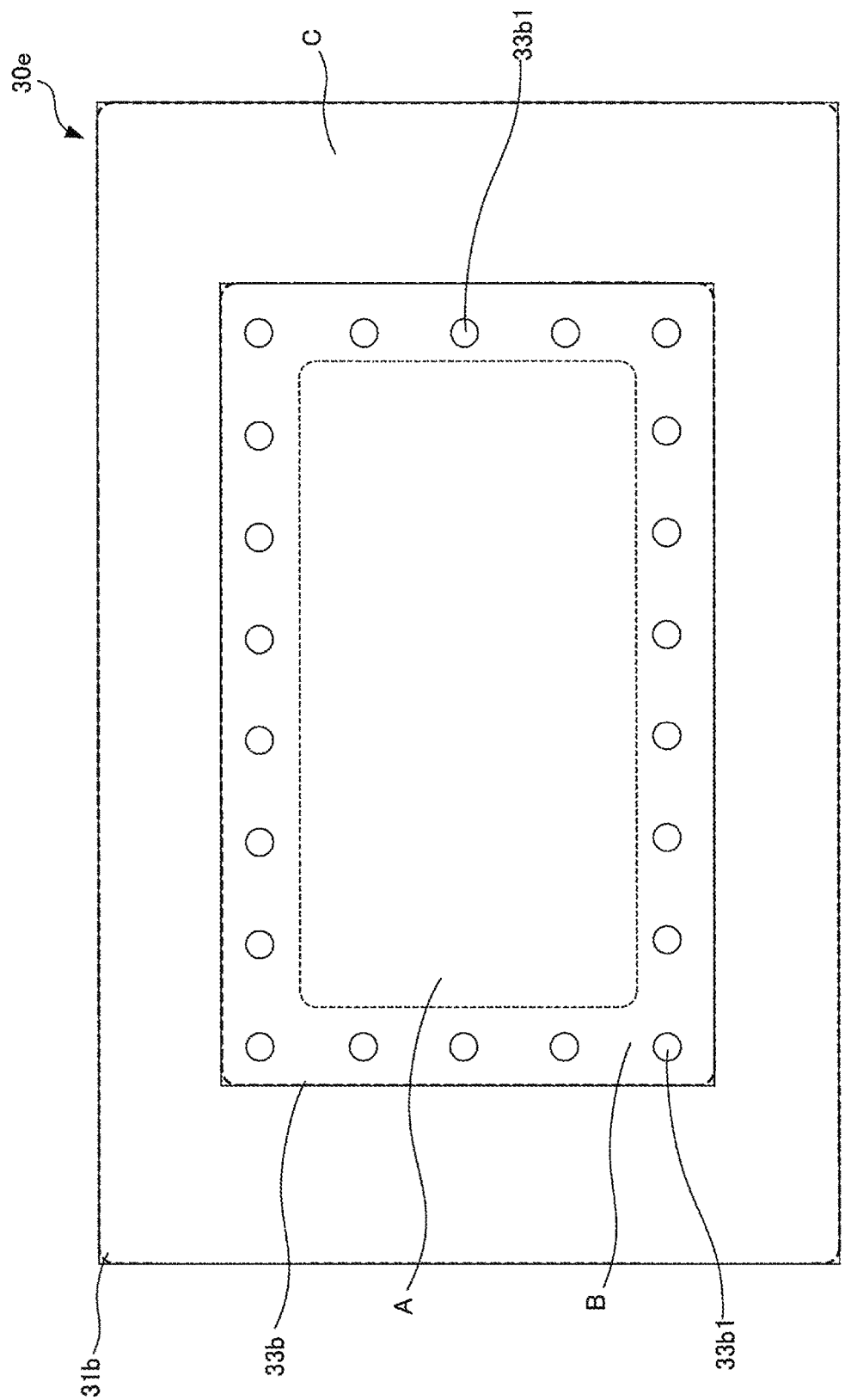
FIG. 14 shows a plan view of a heat dissipating unit of the semiconductor device of Embodiment 7.

FIG. 13 is a side cross-sectional view of the semiconductor device of Embodiment 7, and FIG. 14 is a plan view of a heat dissipating unit of the semiconductor device of Embodiment 7. FIG. 14 shows a plan view of the front surface of the heat dissipating unit 30e (on the side where the semiconductor unit 20a is placed).

In Embodiment 7, the same reference characters are given to configurations that are the same as Embodiments 1 to 6, and explanations of these configurations may be omitted.

The semiconductor device 10f contains the semiconductor unit 20a and the heat dissipating unit 30e.

Among these, the heat dissipating unit 30e has the flat plate part 31b, fin part 32, and embedded part 33b.

The embedded part 33b is embedded inside the mounting region A and sealed region B dug into the front surface of the flat plate part 31b. At this time, the front surface of the flat plate part 31b and the front surface of the embedded part 33b are horizontal. The second metal material forming this type of embedded part 33b is copper or a copper alloy, or an MMC, similar to Embodiment 1.

Moreover, similar to Embodiment 1, the volumetric mass density of the flat plate part 31b and fin part 32 (together referred to as the primary part) is less than the volumetric mass density of the embedded part 33b, at 2.7 g/cm$^3$ (aluminum or aluminum alloy). The volumetric mass density of the embedded part 33b is 8.9 g/cm$^3$ (copper or copper alloy) or 2.8 g/cm$^3$ (MMC).

In addition, the embedded part 33b has a plurality of protrusions 33b1 formed in the sealed region B along the sides of the mounting region A. The protrusions 33b1 shown in FIG. 13 and FIG. 14 are one example. The shape of the protrusion 33b1 can be a cylindrical shape, a semi-spherical shape, a cuboid shape, a trigonal pyramid shape, a quadrangular pyramid shape, or the like. The arrangement of the protrusions 33b1 is not limited to one row, and can be a plurality of rows or the like.

Accordingly, in regard to the volume of the heat dissipating unit 30e of the semiconductor device 10f, the primary part makes up 67% of the volume, and the embedded part 33b makes up 33%. Therefore, in terms of the weight ratio, assuming that the weight of the heat dissipating unit 30e made completely of copper is 100, then the weight of the heat dissipating unit 30e when the primary part is made of aluminum or an aluminum alloy and the embedded part 33b is made of copper or a copper alloy would be 53. Thus, the volumetric mass density of the primary part is less than the volumetric mass density of the embedded part 33b, and the volume of the primary part is greater than the volume of the embedded part 33b, which makes it possible to suppress an increase in weight of the heat dissipating unit 30e.

This type of semiconductor device 10f can also be manufactured in a similar manner to Embodiment 3.

Similar to Embodiment 1, in the semiconductor device 10f configured in this manner, because the absolute difference of the linear expansion coefficient of the sealing member 25 and the linear expansion coefficient of the embedded part 33b (sealed region B) is less than or equal to approximately 25% of the value of the linear expansion coefficient of the sealing member 25, then it is thought that peeling will not occur between the sealing member 25 and the embedded part 33b.

Accordingly, the semiconductor device 10f has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10f also has the heat dissipating unit 30e. The heat dissipating unit 30e includes the flat plate part 31b and the fin part 32 made of aluminum or an aluminum alloy. The heat dissipating unit 30e is also provided with the embedded part 33b, which is embedded in the front surface of the flat plate part 31b and made of copper or a copper alloy (or an MMC). In addition, the sealing member 25 seals the semiconductor elements 22a, 22b, ceramic circuit substrate 21, and front surface of the heat dissipating unit 30e. Moreover, the front surface of the heat dissipating unit 30e of the semiconductor device 10f includes the mounting region A on which the ceramic circuit substrate 21 is disposed, the sealed region B adjacent to the mounting region A and sealed by the sealing member 25, and the peripheral region C surrounding the outer side of the sealed region B and on which the case 26 is bonded. The embedded part 33b is formed in at least the sealed region B, the linear expansion coefficient of the copper or copper alloy (or MMC) is smaller than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25. Additionally, in the semiconductor device 10f, the plurality of protrusions 33b1 are formed in the sealed region B of the embedded part 33b of the heat dissipating unit 30e.

In this type of semiconductor device 10f as well, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10f as well, the difference of the linear expansion coefficient of the sealing member 25 and the linear expansion coefficient of the sealed region B of the embedded part 33b of the heat dissipating unit 30e sealed by the sealing member 25 is small: less than or equal to 25% of the value of the linear expansion coefficient of the sealing member 25. Moreover, in the semiconductor device 10f, the plurality of protrusions 33b1 are formed in the sealed region B of the embedded part 33b, thus increasing the contact area between the sealing member 25 and the sealed region B, along with improving the bonding strength of the sealing member 25 to the sealed region B due to the anchor effect of the protrusions 33b1. This suppresses peeling of the sealing member 25 in the sealed region B of the embedded part 33b of the heat dissipating unit 30e.

The primary part, which makes up a large portion of the heat dissipating unit 30e, is made of aluminum or an aluminum alloy, and the embedded part 33b, which has less volume than the primary part, can be made of copper or a copper alloy. Furthermore, the volumetric mass density of the primary part is less than the volumetric mass density of the embedded part 33b. Thus, it is possible for the heat dissipating unit 30e to be made lightweight.

Moreover, in the semiconductor device 10f as well, the embedded part 33b made of copper or a copper alloy is provided in the mounting region A in which the ceramic circuit substrate 21 is mounted. This type of embedded part 33b has a high thermal conductivity and excellent heat dissipating characteristics as compared to the primary part, which is made of aluminum or an aluminum alloy. Due to this, the semiconductor device 10f has cooling characteristics for the semiconductor elements 22a, 22b that are more improved than the semiconductor device 10 of Embodiment 1.

Accordingly, the semiconductor device 10f makes it possible to lower costs and suppress a decrease in reliability.

Embodiment 8

In Embodiment 8, an example will be described in which, in the semiconductor device 10b of Embodiment 3, recesses have been formed in the sealed region B of the heat dissipating unit 30b.

A semiconductor device 10g of Embodiment 8 will be described using FIG. 15.

Figure 15:
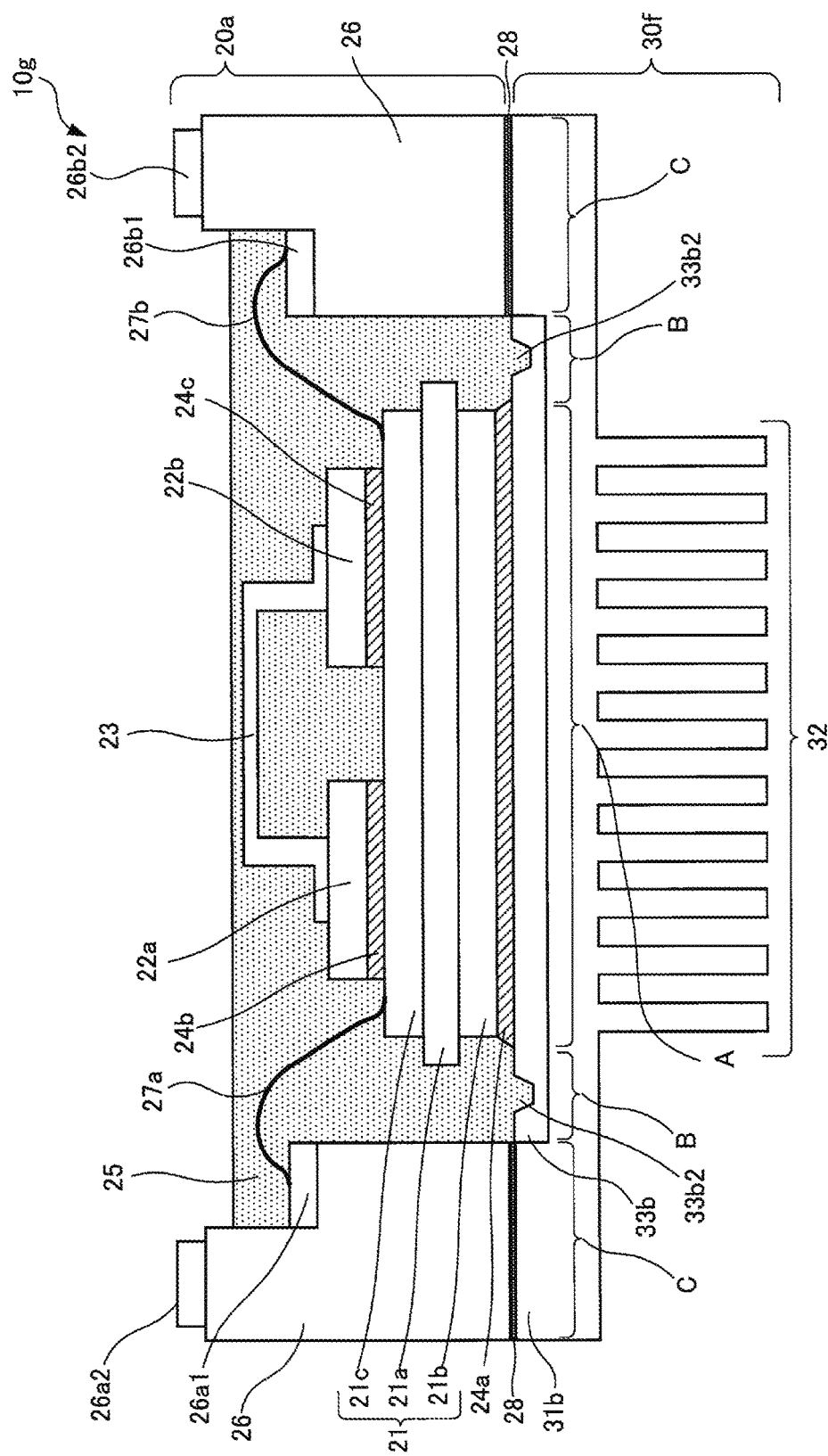
FIG. 15 shows a side cross-sectional view of a semiconductor device of Embodiment 8.

FIG. 15 shows a side cross-sectional view of the semiconductor device of Embodiment 8.

In Embodiment 8, the same reference characters are given to configurations that are the same as Embodiments 1 to 7, and explanations of these configurations may be omitted.

The semiconductor device 10g contains the semiconductor unit 20a and a heat dissipating unit 30f.

Among these, the heat dissipating unit 30f has the flat plate part 31b, fin part 32, and embedded part 33b.

The embedded part 33b is embedded inside the mounting region A and sealed region B dug into the front surface of the flat plate part 31b. At this time, the front surface of the flat plate part 31b and the front surface of the embedded part 33b are horizontal. The second metal material forming this type of embedded part 33b is copper or a copper alloy, or an MMC, similar to Embodiment 1.

Moreover, similar to Embodiment 1, the volumetric mass density of this type of flat plate part 31b and fin part 32 (together referred to as the primary part) is less than the volumetric mass density of the embedded part 33b, at 2.7 g/cm$^3$ (aluminum or aluminum alloy). The volumetric mass density of the embedded part 33b is 8.9 g/cm$^3$ (copper or copper alloy) or 2.8 g/cm$^3$ (MMC).

In addition, the embedded part 33b has a plurality of recesses 33b2 formed in the sealed region B along the sides of the mounting region A. The formation places of the recesses 33b2 in the sealed region B correspond to the protrusions 33b1 in FIG. 13, for example. The shape of this type of recess 33b2 can be a cylindrical shape, a semispherical shape, a cuboid shape, a trigonal pyramid shape, a quadrangular pyramid shape, or the like. The arrangement of the recesses 33b2 is not limited to one row, and can be a plurality of rows or the like.

Accordingly, in regard to the volume of the heat dissipating unit 30f of the semiconductor device 10g, the primary part makes up 67% of the volume, and the embedded part 33b makes up 33%. Therefore, in terms of the weight ratio, assuming that the weight of the heat dissipating unit 30f made completely of copper is 100, then the weight of the heat dissipating unit 30f when the primary part is made of aluminum or an aluminum alloy and the embedded part 33b is made of copper or a copper alloy would be 53. Thus, the volumetric mass density of the primary part is less than the volumetric mass density of the embedded part 33b, and the volume of the primary part is greater than the volume of the embedded part 33b, which makes it possible to suppress an increase in weight of the heat dissipating unit 30f.

This type of semiconductor device 10g can also be manufactured in a similar manner to Embodiment 3.

Similar to Embodiment 1, in the semiconductor device 10g configured in this manner, because the difference of the linear expansion coefficient of the sealing member 25 and the linear expansion coefficient of the embedded part 33b (sealed region B) is less than or equal to approximately 25% of the value of the linear expansion coefficient of the sealing member 25, then it is thought that peeling will not occur between the sealing member 25 and the embedded part 33b.

Accordingly, the semiconductor device 10g has the semiconductor elements 22a, 22b, and the ceramic circuit substrate 21 having the insulated plate 21a and the circuit layer 21c formed on the front surface of the insulated plate 21a, with the semiconductor elements 22a, 22b being disposed on the front surface of the circuit layer 21c. The semiconductor device 10g also has the heat dissipating unit 30f. The heat dissipating unit 30f includes the flat plate part 31b and the fin part 32 made of aluminum or an aluminum alloy. The heat dissipating unit 30f is also provided with the embedded part 33b, which is embedded in the front surface of the flat plate part 31b and made of copper or a copper alloy (or an MMC). In addition, the sealing member 25 seals the semiconductor elements 22a, 22b, ceramic circuit substrate 21, and front surface of the heat dissipating unit 30f. Moreover, the front surface of the heat dissipating unit 30f of the semiconductor device 10g includes the mounting region A on which the ceramic circuit substrate 21 is disposed, the sealed region B adjacent to the mounting region A and sealed by the sealing member 25, and the peripheral region C surrounding the outer side of the sealed region B and on which the case 26 is bonded. The embedded part 33b is formed in at least the sealed region B, the linear expansion coefficient of the copper or copper alloy (or MMC) is smaller than the linear expansion coefficient of the aluminum or aluminum alloy, and the absolute difference of the linear expansion coefficient of the copper or copper alloy (or MMC) and the linear expansion coefficient of the sealing member 25 is less than or equal to 25% of the value of the linear expansion coefficient of the sealing member 25. Additionally, in the semiconductor device 10g, the plurality of recesses 33b2 are formed in the sealed region B of the embedded part 33b of the heat dissipating unit 30f.

In this type of semiconductor device 10g as well, the sealing by the sealing member 25 maintains insulating characteristics while making it possible to reduce stress exerted on the solder 24a, 24b, 24c. Thus, it is possible to extend the lifespan of the solder 24a, 24b, 24c.

Furthermore, in this type of semiconductor device 10g as well, the absolute difference of the linear expansion coefficient of the sealing member 25 and the linear expansion coefficient of the sealed region B of the embedded part 33b of the heat dissipating unit 30f sealed by the sealing member 25 is small: less than or equal to 25% of the value of the linear expansion coefficient of the sealing member 25. Moreover, in the semiconductor device 10g, the plurality of recesses 33b2 are formed in the sealed region B of the embedded part 33b, thus increasing the contact area between the sealing member 25 and the sealed region B, along with improving the bonding strength of the sealing member 25 to the sealed region B. This suppresses peeling of the sealing member 25 in the sealed region B of the embedded part 33b of the heat dissipating unit 30f.

The primary part, which makes up a large portion of the heat dissipating unit 30f, is made of aluminum or an aluminum alloy, and the embedded part 33b, which has a lower volume than the primary part, is made of copper or a copper alloy (or an MMC). Thus, it is possible for the heat dissipating unit 30f to be made lightweight.

Moreover, in the semiconductor device 10g as well, the embedded part 33b made of copper or a copper alloy (or an MMC) is provided in the mounting region A in which the ceramic circuit substrate 21 is mounted. The embedded part 33b has a high thermal conductivity and excellent heat dissipating characteristics as compared to the primary part, which is made of aluminum or an aluminum alloy. Due to this, the semiconductor device 10g has cooling characteristics for the semiconductor elements 22a, 22b that are more improved than the semiconductor device 10 of Embodiment 1.

Accordingly, the semiconductor device 10g makes it possible to lower costs and suppress a decrease in reliability.

The plurality of protrusions 33b1 of Embodiment 7 and recesses 33b2 of Embodiment 8 can be respectively formed in the sealed regions B (embedded parts 33, 33a, 33b, 33c, 33d) of the heat dissipating units 30, 30a, 30b, 30c, 30d of the semiconductor devices 10, 10a, 10b, 10c, 10d, 10e in Embodiments 1-6. This improves the bonding strength of the sealing member 25 to the sealed region B more than if the protrusions 33b1 and recesses 33b2 were not provided.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor element;
   a substrate that includes an insulated plate and a circuit layer on a front surface of the insulated plate, the semiconductor element being disposed on a front surface of the circuit layer;
   a heat dissipating unit that includes a primary part made of a first metal material and an embedded part that is embedded in a front surface of the primary part and that is made of a second metal material, a front surface of the heat dissipating unit having a mounting region on which a rear surface of the substrate is mounted so as to dissipate heat generated by the semiconductor element; and
   a sealing member that seals the semiconductor element, the substrate, and a sealed region of the front surface of the heat dissipating unit that is defined as an exposed region that is adjacent to the mounting region and that is not covered by the substrate,
   wherein the embedded part is formed in an area in the front surface of the heat dissipating unit that includes at least an entirety of the sealed region, and
   wherein a linear expansion coefficient of the second metal material is less than a linear expansion coefficient of the first metal material, and an absolute difference of the linear expansion coefficient of the second metal material and a linear expansion coefficient of the sealing member is less than or equal to 25% of a value of the linear expansion coefficient of the sealing member.

2. The semiconductor device according to claim 1, wherein the sealed region surrounds the mounting region in a plan view.

3. The semiconductor device according to claim 2, wherein the area in which the embedded part is formed extends beyond the sealed region and includes an entirety of the mounting region in the plan view.

4. The semiconductor device according to claim 1, wherein a volumetric; mass density of the first metal material is less than a volumetric mass density of the second metal material.

5. The semiconductor device according to claim 1, wherein the linear expansion coefficient of the second metal material is greater than or equal to 10.5 ppm/° C. and is less than or equal to 22.5 ppm/° C.

6. The semiconductor device according to claim 5, wherein the linear expansion coefficient of the second metal material is greater than or equal to 16.0 ppm/° C. and is less than or equal to 18.0 ppm/° C.

7. The semiconductor device according to claim 6, wherein the second metal material is copper, a copper alloy, or a metal matrix composite material.

8. The semiconductor device according to claim 7, wherein the metal matrix composite material is a composite material containing silicon carbide.

9. The semiconductor device according to claim 8, wherein the metal matrix composite material contains one of aluminum and magnesium in addition to the silicon carbide.

10. The semiconductor device according to claim 1, wherein the area in which the embedded part is formed extends beyond the sealed region and includes a part of the mounting region in a plan view so that an inner edge of said area is positioned inside the mounting region on which the substrate is mounted in the plan view.

11. The semiconductor device according to claim 1, wherein a linear expansion coefficient of the sealing member is greater than or equal to 14.0 ppm/° C. and is less than or equal to 18.0 ppm/° C.

12. The semiconductor device according to claim 11, wherein the sealing member includes an epoxy resin and a filler contained in the epoxy resin.

13. The semiconductor device according to claim 12, wherein the filler is silicon dioxide, aluminum oxide, boron nitride, or aluminum nitride.

14. The semiconductor device according to claim 1, wherein the first metal material is aluminum or an aluminum alloy.

15. The semiconductor device according to claim 2, further comprising a case having sidewalls that are mounted, via a bonding material, on a peripheral region of the front surface of the heat dissipating unit that surrounds the sealed region.

16. The semiconductor device according to claim 15, wherein the area in which the embedded part is formed extends beyond the sealed region and includes a part of the peripheral region in a plan view so that an outer edge of said area is positioned inside the peripheral region on which the sidewalls of the case are mounted in the plan view.

17. The semiconductor device according to claim 1, wherein the embedded part has a plurality of protrusions that protrude from the front surface of the heat dissipating unit in the sealed region.

18. The semiconductor device according to claim 1, wherein the embedded part has a plurality of recesses in the front surface of the heat dissipating unit in the sealed region.

19. The semiconductor device according to claim 15, wherein a metal film or an oxide film is formed in the peripheral region of the heat dissipating unit.

20. The semiconductor device according to claim 1, wherein the primary part of the heat dissipating unit comprises:
- a flat plate part having a flat plate shape, the mounting region and the sealed region being defined in a front surface of the flat plate part; and
- a fin part having a plurality of fins extending downwardly, formed on a rear surface of the flat plate part.

* * * * *